(12) United States Patent
So et al.

(10) Patent No.: US 9,620,240 B2
(45) Date of Patent: Apr. 11, 2017

(54) SHIFT REGISTER

(71) Applicant: LG Display Co., Ltd., Seoul (KR)

(72) Inventors: Byeong-Seong So, Paju-si (KR); Joung-Mi Choi, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 42 days.

(21) Appl. No.: 14/290,808

(22) Filed: May 29, 2014

(65) Prior Publication Data
US 2014/0354523 A1 Dec. 4, 2014

(30) Foreign Application Priority Data

May 30, 2013 (KR) .......................... 10-2013-0061481

(51) Int. Cl.
G11C 19/28 (2006.01)
G09G 3/36 (2006.01)

(52) U.S. Cl.
CPC ........... *G11C 19/28* (2013.01); *G09G 3/3677* (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 2006/0279511 A1* | 12/2006 | Uh .......................... | G11C 19/28 345/100 |
| 2011/0310074 A1* | 12/2011 | Ochiai .................. | G09G 3/3674 345/208 |
| 2012/0139883 A1 | 6/2012 | Lee et al. | |
| 2012/0212275 A1* | 8/2012 | Jang ..................... | G09G 3/3677 327/295 |
| 2013/0010916 A1* | 1/2013 | Jang ..................... | G09G 3/3677 377/64 |
| 2013/0016804 A1* | 1/2013 | Ahn ....................... | G11C 19/28 377/64 |

FOREIGN PATENT DOCUMENTS

| | | |
|---|---|---|
| CN | 101089939 | 12/2007 |
| CN | 101477836 | 7/2009 |
| CN | 102779478 | 11/2012 |
| CN | 102819998 | 12/2012 |
| CN | 102867490 | 1/2013 |
| KR | 10-2009-0050358 | 5/2009 |

OTHER PUBLICATIONS

Office Action for Chinese Patent Application No. CN 201410238657.1 dated Mar. 3, 2016, 18 Pages.

* cited by examiner

*Primary Examiner* — David D Davis
(74) *Attorney, Agent, or Firm* — Fenwick & West LLP

(57) ABSTRACT

Disclosed is a shift register including stages for sequentially outputting output pulses including carry and scan pulses. Odd-numbered stages supply corresponding scan pulses to odd-numbered gate lines in a sequential manner, and even-numbered stages supply corresponding scan pulses to even-numbered gate lines in a sequential manner. Each stage includes a carry output unit for generating a carry pulse, based on a first discharge voltage and a clock pulse having a low-level voltage equal to the first discharge voltage, and supplying the carry pulse to at least one of upstream and downstream stages, and a scan output unit for generating a scan pulse, based on a second discharge voltage having a higher voltage than the first discharge voltage and the clock pulse, and supplying the scan pulse to a corresponding gate line.

27 Claims, 7 Drawing Sheets

SHIFT REGISTER

CROSS REFERENCE TO RELATED APPLICATIONS

This application claims the benefit of the Korean Patent Application No. 10-2013-0061481, filed on May 30, 2013, which is hereby incorporated by reference as if fully set forth herein.

BACKGROUND OF THE INVENTION

Field of the Invention

The present invention relates to a shift register and, more particularly, to a shift register capable of achieving an enhancement in drivability through prevention of leakage current, and reducing bezel size through reduction in the falling edge time of a scan pulse.

Discussion of the Related Art

In general, a liquid crystal display (LCD) device is adapted to display an image by adjusting light transmittance of a liquid crystal using an electric field. To this end, the LCD device includes a liquid crystal panel having pixel areas arranged in matrix form, and a driving circuit for driving the liquid crystal panel.

In the liquid crystal panel, a plurality of gate lines and a plurality of data lines are arranged to cross each other, and the pixel areas are defined respectively at intersections of the gate lines and the data lines. Also formed in the liquid crystal panel are pixel electrodes and a common electrode for applying the electric field to the respective pixel areas.

Each of the pixel electrodes is connected to an associated one of the data lines via the source terminal and drain terminal of a thin film transistor (TFT), which is a switching device. The TFT is turned on in response to a scan pulse applied to the gate terminal thereof via an associated one of the gate lines, so as to charge a data signal on the associated data line to a pixel voltage.

The driving circuit includes a gate driver for driving the gate lines, a data driver for driving the data lines, a timing controller for supplying control signals for control of the gate driver and data driver, and a power supply for supplying various drive voltages to be used in the LCD device.

The gate driver sequentially supplies scan pulses to the gate lines to sequentially drive liquid crystal cells in the liquid crystal panel on a line-by-line basis. In order to sequentially output the above-mentioned scan pulses, the gate driver includes a shift register.

In a conventional case, the shift register includes a plurality of stages each having a plurality of switching elements.

Each stage includes a pull-up switching element for outputting a scan pulse. That is, the pull-up switching element outputs, in an ON state thereof, a clock pulse input received from the outside of the driving circuit, as scan pulses Vout1 to Vout3. In the conventional case, a single discharge voltage is used and, as such, leakage current generated at the pull-up switching element in a discharged state (disable state) of the set node in the stage is large. Such leakage current drops the high-level voltage value of the scan pulse output from the stage when the stage is in an enable state, thereby reducing drivability of the shift register. As a result, degradation of picture quality occurs in an image display apparatus.

SUMMARY OF THE INVENTION

Accordingly, the present invention is directed to a shift register that substantially obviates one or more problems due to limitations and disadvantages of the related art.

An objective of the present invention is to provide a shift register in which two discharge voltages having different voltage values are supplied to each stage, and an output unit of each stage is divided into a carry output unit connected to a relatively small load and a scan output unit connected to a relatively large load and, as such, a small pull-up switching element and a first one of the discharge voltages are provided at the carry output unit, and a large pull-up switching element and a second one of the discharge voltages are provided at the scan output unit, thereby being capable of preventing generation of leakage current in a disable period through supply of a relatively low discharge voltage generated from the carry output unit to a gate electrode of a first switching element in each stage.

Additional advantages, objectives, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objectives and other advantages and in accordance with the purpose of the invention, as embodied and broadly described herein, a shift register includes a plurality of stages for sequentially outputting output pulses including carry pulses and scan pulses, wherein odd-numbered ones of the plural stages supply corresponding ones of the scan pulses to odd-numbered gate lines in a sequential manner, respectively, and even-numbered ones of the plural stages supply corresponding ones of the scan pulses to even-numbered gate lines in a sequential manner, respectively, wherein each of the stages includes a carry output unit for generating a carry pulse, based on a first discharge voltage and a clock pulse having a low-level voltage with a level equal to the first discharge voltage, and supplying the generated carry pulse to at least one of upstream and downstream ones of the stages, and a scan output unit for generating a scan pulse, based on a second discharge voltage having a higher voltage value than the first discharge voltage and the clock pulse, and supplying the generated scan pulse to a corresponding one of the gate lines.

The shift register may further include compensation switching elements each controlled in accordance with corresponding ones of the scan pulses from the stages, to supply the first discharge voltage to one of the gate lines.

Each of odd-numbered ones of the compensation switching elements may be controlled by the scan pulse from a corresponding one of the even-numbered stages, and may be connected between a first discharge voltage line to transmit the first discharge voltage and a corresponding one of the odd-numbered gate lines. Each of even-numbered ones of the compensation switching elements may be controlled by the scan pulse from a corresponding one of the odd-numbered stages, and may be connected between the first discharge voltage line and a corresponding one of the even-numbered gate lines.

An n-th one of the stages (n being a natural number greater than 5) may include a node controller for controlling signal states of a set node, a first reset node and a second reset node. The node controller of the n-th stage may include a first switching element controlled in accordance with the carry pulse from the (n-x)-th stage (x being a natural number smaller than n), and connected between a charge voltage line to transmit a charge voltage and the set node.

The first reset node of a (4k+1)-th one of the stages (k being a natural number) may be connected to the first reset node of a (4k+3)-th one of the stages. The second reset node of the (4k+1)-th stage may be connected to the second reset node of the (4k+3)-th stage. The first reset node of a (4k+2)-th one of the stages may be connected to the first reset node of a (4k+4)-th one of the stages. The second reset node of the (4k+2)-th stage may be connected to the second reset node of the (4k+4)-th stage. The clock pulse applied to the (4k+1)-th stage and the clock pulse applied to the (4k+3)-th stage may have different phases. The clock pulse applied to the (4k+2)-th stage and the clock pulse applied to the (4k+4)-th stage may have different phases.

When the n-th stage corresponds to one of the (4k+1)-th stage and the (4k+2)-th stage, the node controller of the n-th stage may further include a second switching element controlled in accordance with the carry pulse from the (n+y)-th stage (y being a natural number), and connected between the set node and the first discharge voltage line to the first discharge voltage, a third switching element controlled in accordance with a voltage at the first reset node, and connected between the set node and the first discharge voltage line, a fourth switching element controlled in accordance with a voltage at the second reset node, and connected between the set node and the first discharge voltage line, a fifth switching element controlled in accordance with a voltage at the set node, and connected between the first reset node and the first discharge voltage line, a sixth switching element controlled in accordance with the voltage at the set node, and connected between a first AC voltage line to transmit a first AC voltage and the first discharge voltage line, and a seventh switching element controlled in accordance with the first AC voltage, and connected between the first AC voltage line and the first reset node.

When the n-th stage corresponds to one of the (4k+3)-th stage and the (4k+4)-th stage, the node controller of the n-th stage may further include a second switching element controlled in accordance with the carry pulse from the (n+y)-th stage (y being a natural number), and connected between the set node and the first discharge voltage line to the first discharge voltage, a third switching element controlled in accordance with a voltage at the first reset node, and connected between the set node and the first discharge voltage line, a fourth switching element controlled in accordance with a voltage at the second reset node, and connected between the set node and the first discharge voltage line, a fifth switching element controlled in accordance with a voltage at the set node, and connected between the second reset node and the first discharge voltage line, a sixth switching element controlled in accordance with the voltage at the set node, and connected between a second AC voltage line to transmit a second AC voltage and the first discharge voltage line, and a seventh switching element controlled in accordance with the second AC voltage, and connected between the second AC voltage line and the second reset node.

The carry output unit of the n-th stage may include a carry pull-up switching element controlled in accordance with a voltage at the set node, and connected between a clock transmission line to transmit the clock pulse and a carry output terminal of the n-th stage, a first carry pull-down switching element controlled in accordance with a voltage at the first reset node, and connected between the carry output terminal of the n-th stage and the first discharge voltage line to transmit the first discharge voltage, and a second carry pull-down switching element controlled in accordance with a voltage at the second reset node, and connected between the carry output terminal of the n-th stage and the first discharge voltage line. The carry output terminal of the n-th stage may further be connected to an n+x-th one of the stages, an (n−y)-th one of the stages, and an (n−z)-th one of the compensation switching element.

In some embodiments, x is 2, y is 4, and z is 2.

The scan output unit of the n-th stage includes a scan pull-up switching element controlled in accordance with a voltage at the set node, and connected between a clock transmission line to transmit the clock pulse and a scan output terminal of the n-th stage, a first scan pull-down switching element controlled in accordance with a voltage at the first reset node, and connected between the scan output terminal of the n-th stage and the second discharge voltage line to transmit the second discharge voltage, and a second scan pull-down switching element controlled in accordance with a voltage at the second reset node, and connected between the scan output terminal of the n-th stage and the second discharge voltage line. The scan output terminal of the n-th stage may further be connected to an n-th one of the gate lines.

In some embodiments, x is 2, and y is 4.

The shift register may further include a first dummy stage for receiving a start pulse from an outside, generating a first dummy pulse, based on the start pulse, and supplying the first dummy pulse to a first one of the stages to first generate an output pulse in one frame period, and a second dummy stage for receiving the start pulse, generating a second dummy pulse, based on the start pulse, and supplying the second dummy pulse to a second one of the stages to secondarily generate an output pulse in one frame period. The first dummy pulse may be output earlier than the second dummy pulse.

The first stage may include a node controller for controlling signal states of a set node, a first reset node and a second reset node. The node controller of the first stage may include a first switching element controlled in accordance with the first dummy pulse from the first dummy stage, and connected between a charge voltage line to transmit a charge voltage and the set node.

The node controller of the first stage may further include a second switching element controlled in accordance with the carry pulse from a downstream one of the stages to generate an output later than the first stage, and connected between the set node and the first discharge voltage line to the first discharge voltage, a third switching element controlled in accordance with a voltage at the first reset node, and connected between the set node and the first discharge voltage line, a fourth switching element controlled in accordance with a voltage at the second reset node, and connected between the set node and the first discharge voltage line, a fifth switching element controlled in accordance with a voltage at the set node, and connected between the first reset node and the first discharge voltage line, a sixth switching element controlled in accordance with the voltage at the set node, and connected between a first AC voltage line to transmit a first AC voltage and the first discharge voltage line, and a seventh switching element controlled in accordance with the first AC voltage, and connected between the first AC voltage line and the first reset node.

The downstream stage may be a fifth one of the stages.

The second stage may include a node controller for controlling signal states of a set node, a first reset node and a second reset node. The node controller of the second stage may include a first switching element controlled in accordance with the second dummy pulse from the second dummy stage, and connected between a charge voltage line to transmit a charge voltage and the set node.

The node controller of the second stage may further include a second switching element controlled in accordance with the carry pulse from a downstream one of the stages to generate an output later than the second stage, and connected between the set node and the first discharge voltage line to the first discharge voltage, a third switching element controlled in accordance with a voltage at the first reset node, and connected between the set node and the first discharge voltage line, a fourth switching element controlled in accordance with a voltage at the second reset node, and connected between the set node and the first discharge voltage line, a fifth switching element controlled in accordance with a voltage at the set node, and connected between the first reset node and the first discharge voltage line, a sixth switching element controlled in accordance with the voltage at the set node, and connected between a first AC voltage line to transmit a first AC voltage and the first discharge voltage line, and a seventh switching element controlled in accordance with the first AC voltage, and connected between the first AC voltage line and the first reset node.

The downstream stage may be a sixth one of the stages.

The first reset node of the first stage may be connected to the first reset node of a third one of the stages. The first reset node of the second stage may be connected to the first reset node of a fourth one of the stages. The clock pulse applied to the first stage and the clock pulse applied to the third stage may have different phases. The clock pulse applied to the second stage and the clock pulse applied to the fourth stage may have different phases.

When a last one of the stages to last generate an output pulse in one frame period is an m-th one of the stages, the shift register may further include a third dummy stage for supplying a third dummy pulse to an (m−3)-th one of the stages, a fourth dummy stage for supplying a fourth dummy pulse to an (m−2)-th one of the stages, a fifth dummy stage for supplying a fifth dummy pulse to an (m−1)-th one of the stages, and a sixth dummy stage for supplying a sixth dummy pulse to an m-th one of the stages.

The third dummy pulse from the third dummy stage may further be supplied to an (m−2)-th one of the compensation switching elements. The (m−2)-th compensation switching element may be controlled in accordance with the third dummy pulse, and may be connected between the first discharge voltage line to transmit the first discharge voltage and an (m−2)-th one of the gate lines.

The fourth dummy pulse from the fourth dummy stage may further be supplied to an (m−1)-th one of the compensation switching elements. The (m−1)-th compensation switching element may be controlled in accordance with the fourth dummy pulse, and may be connected between the first discharge voltage line to transmit the first discharge voltage and an (m−1)-th one of the gate lines.

The fifth dummy pulse from the fifth dummy stage may further be supplied to an m-th one of the compensation switching elements. The m-th compensation switching element may be controlled in accordance with the fifth dummy pulse, and may be connected between the first discharge voltage line to transmit the first discharge voltage and an m-th one of the gate lines.

The odd-numbered stages may be arranged at one side of the gate lines, and the even-numbered stages may be arranged at the other side of the gate lines.

The even-numbered compensation switching elements may be arranged at the other side of the gate lines, and the odd-numbered compensation switching elements may be arranged at the other side of the gate lines.

Each of the first to fourth dummy pulses may be generated, based on the first discharge voltage and the clock pulse having the low-level voltage with a level equal to the first discharge voltage.

The shift register according to the present invention has the following effects.

First, it may be possible to reduce the leakage current from the scan pull-up switching elements, using two discharge voltages having different levels.

Second, it may be possible to reduce the leakage current from the first switching element of each stage during a disable period, through supply of a relatively low discharge voltage generated from the carry output unit to the gate electrode of the first switching element.

Third, it may be possible to reduce the falling edge time of the scan pulse supplied to each gate line and, as such, it may be possible to increase the margin between scan pulses. In the present invention, accordingly, it may be unnecessary to increase the sizes of the pull-up and pull-down switching elements for reduction of the falling edge time of scan pulses, differently than conventional cases. Thus, it may be possible to considerably reduce the size of the shift register and, as such, the bezel size of the display apparatus may be reduced.

Fourth, each stage only uses switching element to control a single AC voltage and, as such, the number of switching elements used in each stage may be reduced, as compared to conventional cases.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
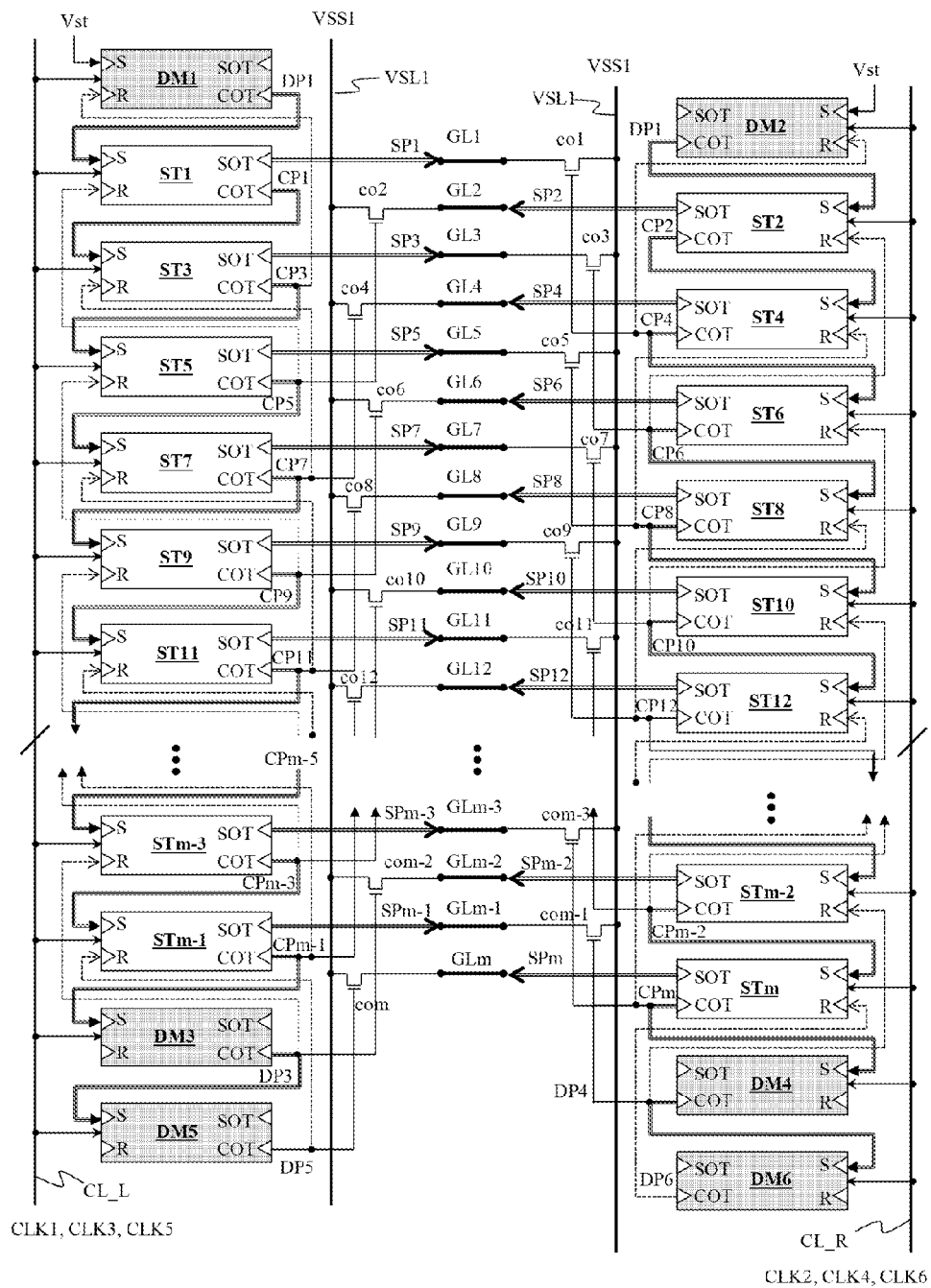
FIG. 1 is a diagram illustrating a shift register according to an embodiment of the present invention.
Figure 2:
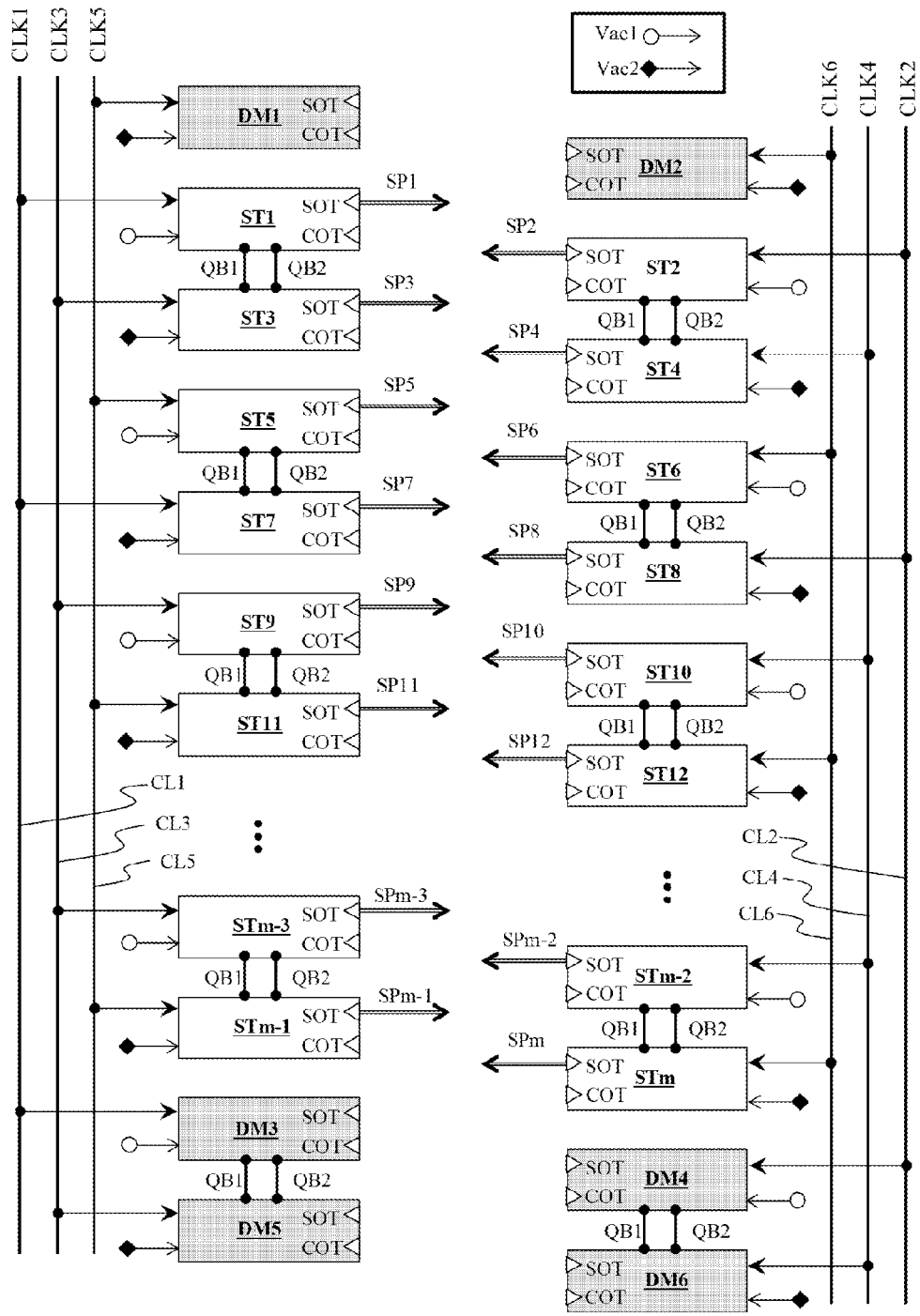
FIG. 2 is a diagram illustrating an example in which 6-phase clock pulses are supplied to stages included in the shift register of FIG. 1.
Figure 3:
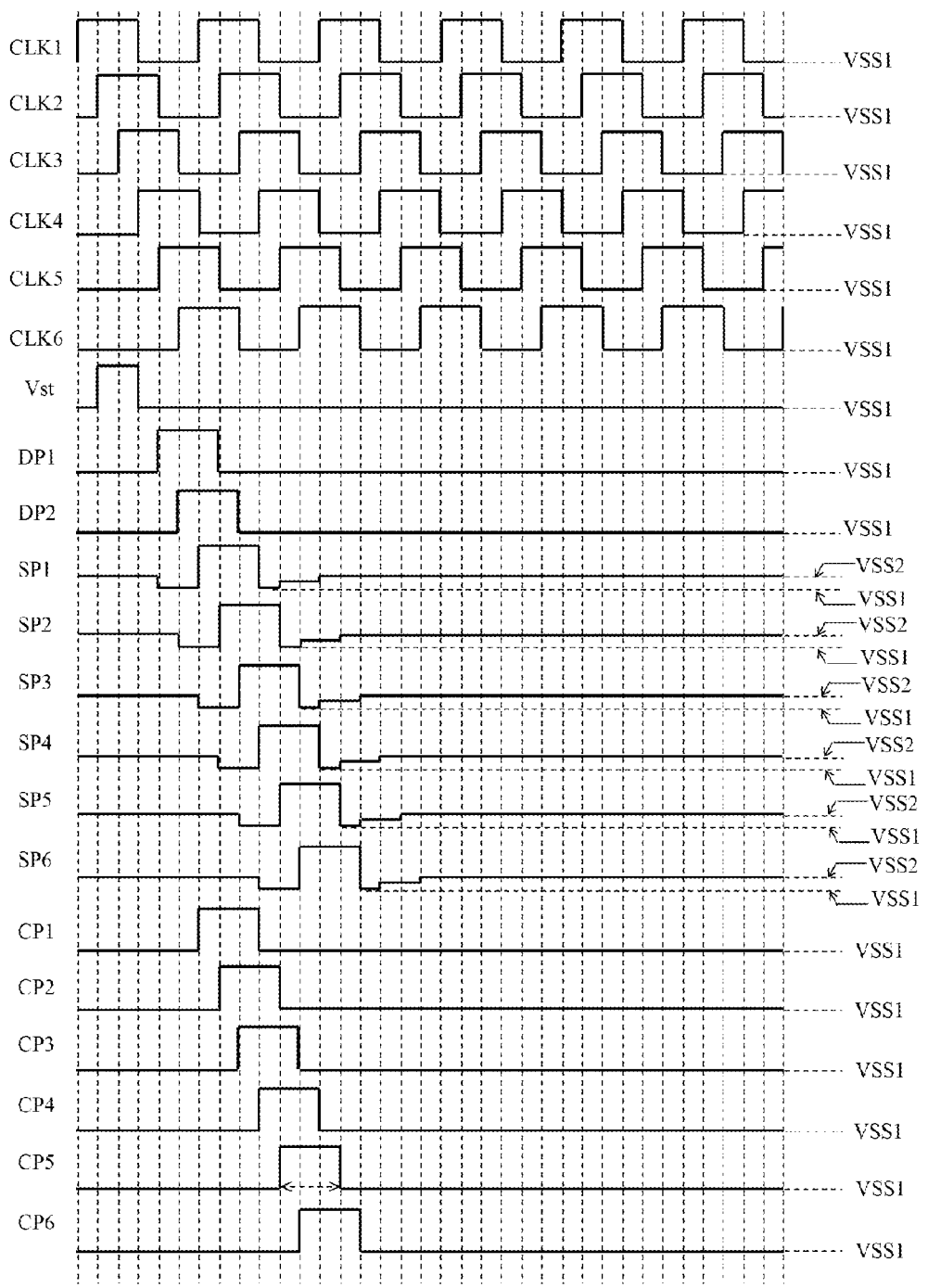
FIG. 3 is a timing diagram of various signals supplied to or output from each stage of FIG. 1.

FIG. 1 is a diagram illustrating a shift register according to an embodiment of the present invention. FIG. 2 is a diagram illustrating an example in which 6-phase clock pulses are supplied to stages included in the shift register of FIG. 1. FIG. 3 is a timing diagram of various signals supplied to or output from each stage of FIG. 1.

As illustrated in FIG. 1, the shift register, according to the embodiment of the present invention, includes m stages ST1 to STm, m compensation switching elements co1 to com, and 6 dummy stages DM1 to DM6.

Odd-numbered ones of the stages ST1 to STm, namely, the stages ST1, ST3, . . . , and STm−1, and odd-numbered ones of the dummy stages DM1 to DM6, namely, the first dummy stage DM1, third dummy stage DM3, and fifth dummy stage DM5, are arranged at a left side of gate lines GL1 to GLm. On the other hand, the even-numbered stages ST2, ST4, . . . , and STm, second dummy stage DM2, fourth dummy stage DM4, and sixth dummy stage DM6 are arranged at a right side of the gate lines GL1 to GLm.

The odd-numbered stages ST1, ST3, . . . , and STm−1 are connected to respective left ends of the corresponding odd-numbered gate lines GL1, GL3, . . . , and GLm−1. The even-numbered stages ST2, ST4, . . . , and STm are connected to respective right ends of the corresponding even-numbered gate lines GL2, GL4, . . . , and GLm.

The odd-numbered stages ST1, ST3, . . . , and STm−1 are connected to a clock transmission line CL_L to transmit odd-numbered clock pulses CLK1, CLK3, and CLK5. The even-numbered stages ST2, ST4, . . . , and STm are connected to a clock transmission line CL_R to transmit even-numbered clock pulses CLK2, CLK4, and CLK6.

Odd-numbered ones of the m compensation switching elements, namely, the compensation switching elements co1, co3, . . . , and com−1, are connected between respective right ends of the odd-numbered gate lines GL1, GL3, . . . , and GLm−1 and a first discharge voltage line VSL1. On the other hand, even-numbered ones of the m compensation switching elements, namely, the compensation switching elements co2, co4, . . . , and com, are connected between respective left ends of the even-numbered gate lines GL2, GL4, . . . , and GLm and the first discharge voltage line VSL1.

The stages ST1 to STm sequentially output output pulses. That is, the stages ST1 to STm output output pulses in a sequential manner from the first stage to the m-th stage. In detail, each of the stages ST1 to STm includes a scan output terminal SOT and a carry output terminal COT. The stages ST1 to STm output corresponding ones of scan pulses SP1 to SPm in a sequential manner for one frame period through scan output terminals SOT thereof, respectively. The stages ST1 to STm also output corresponding ones of carry pulses CP1 to CPm in a sequential manner for one frame period through carry output terminals COT thereof, respectively.

With regard to one frame period, a first one of the m stages outputs a scan pulse and a carry pulse first, and an m-th one of the m stages outputs a scan pulse and a carry pulse last. Here, "i" of the term "i-th stage", which will be described hereinafter, does not mean a position order representing the position of the i-th stage, but means an output order of the scan pulse (or carry pulse) output from the i-th stage, namely, an i-th output order. For example, the second stage is a stage which outputs a scan pulse (or carry pulse) second in one frame period, as compared to the remaining stages. The output timing of the scan pulse from the second stage is later than that of the first stage, but earlier than that of the third stage.

The first and second dummy stages DM1 and DM2 have earlier output orders than those of the stages ST1 to STm connected to the gate lines GL1 to GLm. In this case, the output order of the first dummy pulse DP1 is earlier than that of the second dummy pulse DP2. The third to sixth dummy stages DM3 to DM6 have later output orders than those of the stages ST1 to STm connected to the gate lines GLS to GLm. In this case, the output order of the third dummy pulse is earliest, and the output order of the sixth dummy pulse DP6 is latest.

The scan pulse and carry pulse output from one stage are generated, based on the same clock pulse. Accordingly, the scan pulse and carry pulse output from one stage have the same phase. That is, the scan pulse and carry pulse generated from one stage are simultaneously output.

Each of the stages ST1 to STm drives the gate line connected thereto, using the scan pulse thereof.

Meanwhile, each of the stages ST1 to STm controls operation of at least one of a downstream stage having a later output order than the subject stage and an upstream stage having an earlier output order than the subject stage, using a carry pulse. Some stages also control operations of corresponding ones of compensation switching elements co1 to com, respectively.

For example, the first and second stages ST1 and ST2 supply the carry pulses CP1 and CP2 to respective set terminals S of the third and fourth stages ST3 and ST4 having later output orders than the first and second stages ST1 and ST2. The third stage ST3 supplies the carry pulse CP3 to the set terminal S of the fifth stage ST5 having a later output order than the third stage ST3 and to the reset terminal R of the first dummy stage DM1 having an earlier output order than the third stage ST3. The fourth stage ST4 supplies the carry pulse CP4 to the set terminal S of the sixth stage ST6 having a later output order than the fourth stage ST4, to the reset terminal R of the second dummy stage DM2 having an earlier output order than the fourth stage ST4, and to the gate electrode of the first compensation switching element co1. Each of the fifth to (m−2)-th stages ST5 to STm−2 supplies a corresponding one of the carry pulses CP5 to CPm−2 to the set terminal S of a corresponding one of the seventh to m-th stages ST7 to STm respectively having later output orders than the fifth to (m−2)-th stages ST5 to STm−2, to the reset terminal R of a corresponding one of the first to (m−6)-th stages ST1 to STm−6 respectively having earlier output orders than the fifth to (m−2)-th stages ST5 to STm−2, and to the gate electrode of a corresponding one of the second to (m−5)-th compensation switching elements co1 to com−5. Each of the (m−1)-th and m-th stages STm−1 and STm supplies a corresponding one of the carry pulses CPm−1 and CPm to the set terminal S of a corresponding one of the third and fourth dummy stages DM3 and DM4 respectively having later output orders than the (m−1)-th and m-th stages STm−1 and STm, to the reset terminal R of a corresponding one of the (m−5)-th and (m−4)-th stages STm−5 and STm—4 respectively having earlier output orders than the (m−1)-th and m-th stages STm−1 and STm, and to the gate electrode of a corresponding one of the (m−4)-th and (m−3)-th compensation switching elements com−4 and com−3.

Since there is no second upstream stage associated with the first stage ST1, the first dummy pulse DP1 output from the first dummy stage DM1 is supplied to the set terminal S of the first stage ST1. Similarly, since there is no second upstream stage associated with the second stage ST2, the second dummy pulse DP2 output from the second dummy stage DM2 is supplied to the set terminal S of the second stage ST2.

A start pulse Vst from the timing controller (not shown) is supplied to the set terminals S of the first and second dummy stages DM1 and DM2. After being set in accordance with the start pulse Vst, the first dummy stage DM1 generates the first dummy pulse DP1, using a clock pulse. Similarly, the second dummy stage DM2 generates the second dummy pulse DP2, using a clock pulse, after being set in accordance with the start pulse Vst.

Since there is no fourth downstream stage associated with the (m−3)-th stage STm−3, the third dummy pulse DP3 output from the third dummy stage DM3 is supplied to the reset terminal R of the (m−3)-th stage STm−3. Similarly, since there is no fourth downstream stage associated with the (m−2)-th stage STm−2, the fourth dummy pulse DP4 output from the fourth dummy stage DM4 is supplied to the reset terminal R of the (m−2)-th stage STm−2. Similarly, since there is no fourth downstream stage associated with the (m−1)-th stage STm−1, the fifth dummy pulse DP5 output from the fifth dummy stage DM5 is supplied to the reset terminal R of the (m−1)-th stage STmc−1. Similarly, since there is no fourth downstream stage associated with the m-th stage STm, the sixth dummy pulse DP6 output from the sixth dummy stage DM6 is supplied to the reset terminal R of the m-th stage STm−2.

Each of the stages ST1 to STm and dummy stages DM1 to DM6 performs a set operation in accordance with a carry pulse input to the set terminal S thereof, and performs a reset operation in accordance with a carry pulse input to the reset terminal R thereof.

The start pulse Vst from the timing controller (not shown) is supplied to each set terminal S of the first and second dummy stages DM1 and DM2. As described above, the first dummy stage DM1 generates the first dummy pulse DP1, using a clock pulse, after being set in accordance with the start pulse Vst. Similarly, the second dummy stage DM2 generates the second dummy pulse DP2, using a clock pulse, after being set in accordance with the start pulse Vst.

Although not shown, the third to sixth dummy stages DM3 to DM6 may perform a reset operation in response to the above-described start pulse Vst. To this end, the start pulse Vst may be supplied to each reset terminal R of the third to sixth dummy stages DM3 to DM6.

Each of the above-described first to sixth dummy stages DM1 to DM6 only generates a dummy pulse corresponding to a carry pulse without generating a scan pulse and, as such, the scan output terminals SOT of the first to sixth dummy stages DM1 to DM6 may be omitted.

In accordance with the shift register of the present invention, the same reset nodes of the neighboring two stages are connected, as illustrated in FIG. 2. For example, the first reset node QB1 of the (4k+1)-th stage (k being a natural number including 0) (for example, the fifth stage) is connected to the first reset node QB1 of the (4k+3)-th stage (for example, the seventh stage). Similarly, the second reset node QB2 of the (4k+1)-th stage is connected to the second reset node QB2 of the (4k+3)-th stage. In addition, the first reset node QB1 of the (4k+2)-th stage (for example, the sixth stage) is connected to the first reset node QB1 of the (4k+4)-th stage (for example, the eighth stage). Similarly, the second reset node QB2 of the (4k+2)-th stage is connected to the second reset node QB2 of the (4k+4)-th stage.

The first reset node QB1 of the third dummy stage DM3 is connected to the first reset node QB1 of the fifth dummy stage DM5. The second reset node QB2 of the third dummy stage DM3 is connected to the second reset node QB2 of the fifth dummy stage DM5.

The first reset node QB1 of the fourth dummy stage DM4 is connected to the first reset node QB1 of the sixth dummy stage DM6. The second reset node QB2 of the fourth dummy stage DM4 is connected to the second reset node QB2 of the sixth dummy stage DM6.

The shift register having the above-described configuration may be internally built in various display apparatuses each including a liquid crystal panel. That is, the liquid crystal panel includes a display portion for displaying an image, and a non-display portion surrounding the display portion, and the shift register is built in the non-display portion of the liquid crystal panel.

Each of the stages ST1 to STm and DM1 to DM6 of the shift register having the above-described configuration receives a charge voltage VDD, a first discharge voltage VSS1, a second discharge voltage VSS2, one of first and second AC voltages Vac1 and Vac2, and one of first to sixth clock pulses CLK1 to CLK6 output in a circulating manner while having a phase difference between sequential ones thereof. Meanwhile, the first to sixth dummy stages DM1 to DM6 additionally receive first and second start pulses Vst1 and Vst2.

The charge voltage VDD is mainly used to charge the nodes of the stages ST1 to STm and DM1 to DM6. The first discharge voltage VSS1 is mainly used to discharge the nodes and carry output terminals COT of the stages ST1 to STm and DM1 to DM6. The second discharge voltage VSS2 is mainly used to discharge the scan output terminals SOT of the stages ST1 to STm and DM1 to DM6.

The charge voltage VDD and second discharge voltage VSS2 are DC voltages. The charge voltage VDD may have a positive polarity, and the second discharge voltage VSS2 may have a negative polarity. The second discharge voltage VSS2 may be a ground voltage. The first discharge voltage VSS1 is also a DC voltage. The first discharge voltage VSS1 has a lower value than the second discharge voltage VSS2. The low-level voltage value of each of the clock pulses CLK1 to CLK4 is equal to the voltage value of the first discharge voltage VSS1. For example, the charge voltage VDD may be set to 28V, the first discharge voltage VSS1 may be set to −10V, and the second discharge voltage VSS2 may be set to −5V.

The first and second AC voltages Vac1 and Vac2 are signals for mainly controlling charge and discharge of the reset nodes QB1 and QB2 of the stages ST1 to STm and DM1 to DM6. Each of the stages ST1 to STm and DM1 to DM6 only receives one of the first and second AC voltages Vac1 and Vac2. For example, as illustrated in FIG. 2, the (4k+1)-th and (4k+2)-th stages (for example, the fifth and sixth stages) receive the first AC voltage Vac1, and the (4k+3)-th and (4k+4)-th stages (for example, the seventh and eighth stages) receive the second AC voltage Vac2.

The first and second AC voltages Vac1 and Vac2 are AC voltages. However, the first AC voltage Vac1 has a waveform inverted 180° from that of the second AC voltage Vac2. Each of the first and second AC voltages Vac1 and Vac2 may have a high-level voltage value equal to that of the charge voltage VDD. Each of the first and second AC voltages Vac1 and Vac2 may have a low-level voltage value equal to that of the first and second discharge voltages VSS1 and VSS2. The levels of the first and second AC voltages Vac1 and Vac2 are inverted at intervals of p frame periods. Here, p is a natural number.

The first to sixth clock pulses CLK1 to CLK6 are signals used to generate the scan pulses SP1 to SPm, carry pulses CP1 to CPm, and dummy pulses DP1 to DP6 of the stages ST1 to STm and DM1 to DM6. Each of the stages ST1 to STm and DM1 to DM6 receives one of the first to sixth clock pulses CLK1 to CLK6 and, as such, generates and outputs corresponding ones of the scan pulses SP1 to SPm, carry pulses CP1 to CPm, and dummy pulses DP1 to DP6. For example, as illustrated in FIG. 2, the (6d+1)-th stage outputs a scan pulse and a carry pulse, using the first clock pulse CLK1, the (6d+2)-th stage outputs a scan pulse and a carry pulse, using the second clock pulse CLK2, the (6d+3)-th stage outputs a scan pulse and a carry pulse, using the third clock pulse CLK3, the (6d+4)-th stage outputs a scan pulse and a carry pulse, using the fourth clock pulse CLK4, the (6d+5)-th stage outputs a scan pulse and a carry pulse, using the fifth clock pulse CLK5, and the (6d+6)-th stage outputs a scan pulse and a carry pulse, using the sixth clock pulse CLK6.

Although an example using six clock pulses having different phases is illustrated, any number of different clock pulses may be used, so long as the number of different clock pulses is two or more.

As illustrated in FIG. 3, the first to sixth clock pulses CLK1 to CLK6 are sequentially output while having a phase difference between sequential ones thereof. In this case, each clock pulse has a pulse width corresponding to three horizontal periods. The pulse widths of sequential ones of the clock pulses CLK1 to CLK6 overlap with each other for a period corresponding to two horizontal periods. For example, as illustrated in FIG. 3, the pulse widths of the first and second clock pulses CLK1 and CLK2, which are sequentially output at different times, overlap with each other. That is, the pulse width of the first clock pulse CLK1 corresponding to lower two horizontal periods overlaps with the pulse width of the second clock pulse CLK2 corresponding to upper two horizontal periods.

As described above, the first to sixth clock pulses CLK1 to CLK6 are sequentially output in a circulating manner. In detail, one group of first to sixth clock pulses CLK1 to CLK6 is sequentially output, and another group of first to sixth clock pulses CLK1 to CLK6 is then sequentially output. That is, the first to sixth clock pulses CLK1 to CLK6 are repeatedly output in a sequential manner. Thus, the first clock pulse CLK1 in a current circulation period is output in a period between a time when the sixth clock pulse CLK6 in a previous circulation period is output and a time when the second clock pulse CLK2 in the current circulation period is output.

As illustrated in FIG. 3, the start pulse Vst has a pulse width corresponding to an overlap width between the first clock pulse CLK1 and the second clock pulse CLK2. For example, when the overlap width corresponds to two horizontal periods, the pulse width of the start pulse Vst may correspond to two horizontal periods, as illustrated in FIG. 3.

Each of the first to sixth clock pulses CLK1 to CLK6 is output several times for one frame period. However, the start pulse Vst is output once for one frame period. In other words, each of the first to fourth clock pulses CLK1 to CLK4 periodically exhibits an active state (high-level state) several times for one frame period, whereas the start pulse Vst exhibits an active state once for one frame period.

A plurality of start pulses having different phases may be used, in place of a single start pulse. In this case, the start pulses may be supplied to the first dummy stage DM1 and second dummy stage DM2, respectively.

In order to enable each of the stages St1 to STm and DM1 to DM6 to output associated ones of the scan pulses SP1 to SPm and carry pulses CP1 to CPn+1 or an associated one of the dummy pulses DP1 to DP6, an operation to enable the subject stage may be executed. Here, enabling of a stage means that the stage is set to an output enable state, that is, a state in which the stage can output a clock pulse supplied thereto, as a scan pulse. Each of the stages ST1 to STm and DM1 to DM6 is enabled by a carry pulse supplied thereto from a stage arranged upstream thereof, namely, an upstream stage, which generates an output (a scan pulse or carry pulse), earlier than the subject stage.

For example, the k-th stage is enabled in response to a carry pulse from the (k−2)-th stage. Since there are no negative stages, there is no second upstream stage in association with the first stage ST1 arranged at an uppermost position and, as such, the first stage ST1 is enabled in response to the first dummy pulse DP1 from the first dummy stage DM1. In a similar manner, there is no stage at a second upstream side of the second stage ST2 and, as such, the second stage ST2 is enabled in response to the second dummy pulse DP2 from the second dummy stage DM2.

The first and second dummy stages DM1 and DM2 are enabled by the start pulse Vst from the timing controller.

In addition, each of the stages ST1 to STm and DM1 to DM6 is disabled in response to a carry pulse from a stage arranged downstream thereof, namely, a downstream stage, which generates an output, later than the subject stage. As used herein, disabling of a stage means that the stage is reset to an output disable state, that is, a state in which the stage does not output a clock pulse supplied thereto, as a scan pulse and a carry pulse.

For example, the k-th stage is disabled in response to a carry pulse from the (k+4)-th stage.

In this case, since there is no second downstream stage in association with the (m−3)-th stage STm−3, the m−3-th stage is disabled by the third dummy pulse DP3 from the third dummy stage DM3. Similarly, since there is no second downstream stage in association with the (m−2)-th stage STm−2, the (m−2)-th stage is disabled by the fourth dummy pulse DP4 from the fourth dummy stage DM4. Similarly, since there is no second downstream stage in association with the (m−1)-th stage STm−1, the (m−1)-th stage is disabled by the fifth dummy pulse DP5 from the fifth dummy stage DM4. Similarly, since there is no second downstream stage in association with the m-th stage STm, the m-th stage is disabled by the sixth dummy pulse DP6 from the sixth dummy stage DM6.

The third to sixth stages DM3 to DM6 are enabled by the start pulse Vst from the timing controller.

Hereinafter, the configuration of each of the stages ST1 to STm in the shift register configured as described above will be described in more detail.

Figure 4:
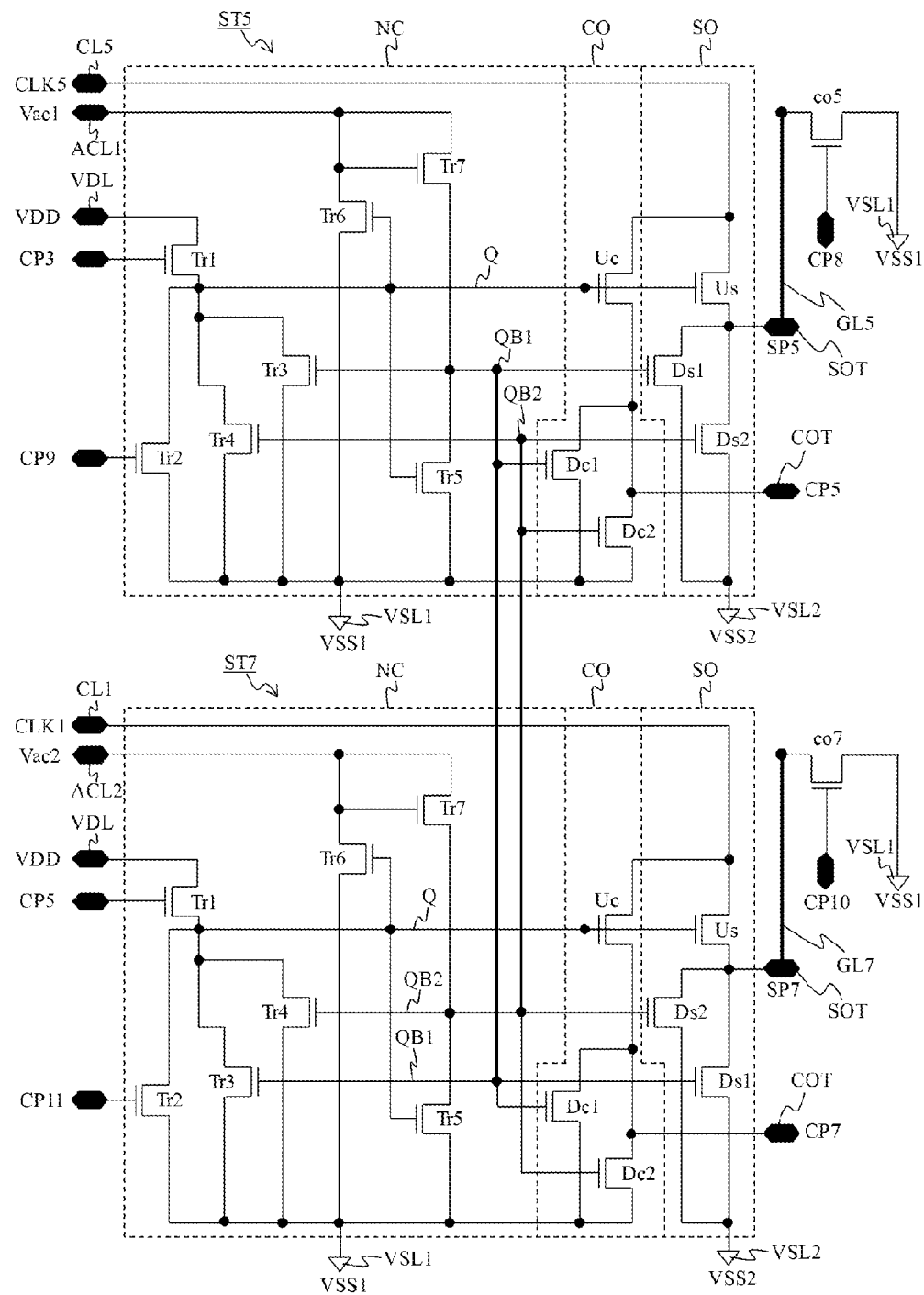
FIG. 4 is a diagram illustrating a configuration of one of the stages illustrated in FIG. 1.

FIG. 4 is a diagram illustrating a configuration of one of the stages illustrated in FIG. 1.

As illustrated in FIG. 4, each of the stages ST1 to STm and DM1 to DM6 includes a set node Q, a first reset node QB1, a second reset node QB2, a node controller NC, a carry output unit CO, and a scan output unit SO.

The node controller NC controls signal states of a set node Q, a first reset node QB1, and a second reset node QB2.

In detail, the node controller NC included in the (4k+1)-th stage (for example, ST5 in FIG. 4) controls the set node Q of the (4k+1)-th stage, the first reset node QB1 of the (4k+1)-th stage, and the first reset node QB1 of the (4k+3)-th stage (for example, ST7 in FIG. 4).

The node controller NC included in the (4k+3)-th stage controls the set node Q of the (4k+3)-th stage, the second reset node QB2 of the (4k+3)-th stage, and the second reset node QB2 of the (4k+1)-th stage. To this end, the first reset nodes QB1 of the (4k+1)-th stage and (4k+3)-th stage are electrically connected, and the second reset nodes QB2 of the (4k+1)-th stage and (4k+3)-th stage are electrically connected, as described above.

Since two stages share reset nodes QB1 and QB2, each of the two stages may receive only one of different AC voltages. That is, although each stage in a conventional case should include a number of switching elements in order to control two AC voltages, each stage in the present invention has switching elements to control one AC voltage and, as such, it may be possible to reduce the number of switching elements in each stage, as compared to the conventional case.

The node controller of the (4k+1)-th stage (an upper one of the stages connected to each other), for example, the node controller NC of the fifth stage ST5 illustrated in FIG. 4, includes first to seventh switch elements Tr1 to Tr7. Hereinafter, the switching elements will be described in detail.

The first switching element Tr1 included in the (4k+1)-th stage is controlled in accordance with a carry pulse from the (4k−1)-th stage (for example, CP3), and is connected between a charge voltage line VDL to transmit the charge voltage VDD and the set node Q of the (4k+1)-th stage. The first switching element Tr1 is turned on or off in accordance with the carry pulse CP3 from the (4k−1)-th stage. In an ON state, the first switching element Tr1 supplies the charge voltage VDD to the set node Q.

The gate electrode of the first switching element Tr1 included in the first stage ST1 is connected to the carry output terminal COT of the first dummy stage DM1, which outputs the first dummy pulse DP1.

The gate electrode of the first switching element Tr1 included in the second stage ST2 is connected to the carry output terminal COT of the second dummy stage DM2, which outputs the second dummy pulse DP2.

The gate electrode of th7e first switching element Tr1 included in each of the first and second dummy stages DM1 and DM2 is connected to a start transmission line (not shown), to which the start pulse Vst is applied.

The gate electrode of the first switching element Tr1 included in the third dummy stage DM3 is connected to the carry output terminal COT of the m−1-th stage STm−1, which outputs the (m−1)-th carry pulse CPm-1.

The gate electrode of the first switching element Tr1 included in the fourth dummy stage DM4 is connected to the carry output terminal COT of the m-th stage STm, which outputs the m-th carry pulse CPm.

The gate electrode of the first switching element Tr1 included in the fifth dummy stage DM5 is connected to the carry output terminal COT of the third dummy stage DM3, which outputs the third dummy pulse CP3.

The gate electrode of the first switching element Tr1 included in the sixth dummy stage DM6 is connected to the carry output terminal COT of the fourth dummy stage DM4, which outputs the fourth dummy pulse CP4.

The second switching element Tr2 included in the (4k+1)-th stage is controlled in accordance with a carry pulse from the (4k+5)-th stage (for example, CP9), and is connected between the set node Q of the (4k+1)-th stage and a first discharge voltage line VSL1 to transmit the first discharge voltage VSS1. The second switching element Tr2 is turned on or off in accordance with the carry pulse CP9 from the (4k+5)-th stage. In an ON state, the second switching element Tr2 supplies the first discharge voltage VSS1 to the set node Q.

The gate electrode of the second switching element Tr2 included in the (m−3)-th stage STm−3 is connected to the carry output terminal COT of the third dummy stage DM3, which outputs the third dummy pulse DP3.

The gate electrode of the second switching element Tr2 included in the m−2-th stage STm−2 is connected to the carry output terminal COT of the fourth dummy stage DM4, which outputs the fourth dummy pulse DP4.

The gate electrode of the second switching element Tr2 included in the (m−1)-th stage STm−1 is connected to the carry output terminal COT of the fifth dummy stage DM5, which outputs the fifth dummy pulse DP5.

The gate electrode of the second switching element Tr2 included in the m-th stage STm is connected to the carry output terminal COT of the sixth dummy stage DM6, which outputs the sixth dummy pulse DP6.

The gate electrode of the second switching element Tr2 included in the first dummy stage DM1 is connected to the carry output terminal COT of the third stage ST3, which outputs the third carry pulse DP3.

The gate electrode of the second switching element Tr2 included in the second dummy stage DM2 is connected to the carry output terminal COT of the fourth stage ST4, which outputs the fourth carry pulse DP4.

The gate electrode of the second switching element Tr2 included in each of the third to sixth dummy stages DM3 to DM6 is connected to the start transmission line (not shown), to which the start pulse Vst is applied.

The third switching element Tr3 included in the (4k+1)-th stage is controlled in accordance with a signal state of the first reset node QB1 of the (4k+1)-th and (4k+3)-th stages connected to each other, and is connected between the set node Q of the (4k+1)-th stage and the first discharge voltage line VSL1. The third switching element Tr3 is turned on or off in accordance with a voltage applied to the first reset node QB1. In an ON state, the third switching element Tr3 supplies the first discharge voltage VSS1 to the set node Q.

The fourth switching element Tr4 included in the (4k+1)-th stage is controlled in accordance with a signal state of the second reset node QB2 of the (4k+1)-th and (4k+3)-th stages connected to each other, and is connected between the set node Q of the (4k+1)-th stage and the first discharge voltage line VSL1. The fourth switching element Tr4 is turned on or off in accordance with a voltage applied to the second reset node QB2. In an ON state, the fourth switching element Tr4 supplies the first discharge voltage VSS1 to the set node Q.

The fifth switching element Tr5 included in the (4k+1)-th stage is controlled in accordance with a signal state of the set node Q of the (4k+1)-th stage, and is connected between the first reset node QB1 of the (4k+1)-th and (4k+3)-th stages and the first discharge voltage line VSL1. The fifth switching element Tr5 is turned on or off in accordance with a voltage applied to the set node Q. In an ON state, the fifth switching element Tr5 supplies the first discharge voltage VSS1 to the first reset node QB1.

The sixth switching element Tr6 included in the (4k+1)-th stage is controlled in accordance with a signal state of the set node Q of the (4k+1)-th stage, and is connected between a first AC voltage line ACL1 to transmit the first AC voltage Vac1 and the first discharge voltage line VSL1. The sixth switching element Tr6 is turned on or off in accordance with a voltage applied to the set node Q. In an ON state, the sixth switching element Tr6 supplies the first discharge voltage VSS1 to the first AC voltage line ACL1.

The seventh switching element Tr7 included in the (4k+1)-th stage is controlled in accordance with the first AC voltage Vac1 from the first AC voltage line ACL1, and is connected between the first reset node QB1 of the (4k+1)-th and (4k+3)-th stages and the first AC voltage line ACL1. The seventh switching element Tr7 is turned on or off in accordance with the first AC voltage Vac1. In an ON state, the seventh switching element Tr7 supplies the first AC voltage Vac1 to the first reset node QB1.

The carry output unit CO and scan output unit SO of each of the stages ST1 to STm and DM1 to DM6 are electrically connected to a set node Q, a first reset node QB1, and a second reset node QB2. Accordingly, the carry output unit CO and scan output unit SO operate under control of the node controller NC.

The carry output unit CO includes a carry output terminal COT, a carry pull-up switching element Uc, a first carry pull-down switching element Dc1, and a second carry pull-down switching element Dc2.

The carry output unit CO outputs a carry pulse or the first discharge voltage VSS1 through the carry output terminal COT. The carry output terminal COT of the k-th stage is connected to the (k+2)-th stage, (k−4)-th stage, and (k−3)-th compensation switching element. In detail, the carry output terminal COT of the k-th stage is connected to the gate terminal of the first switching element Tr1 included in the (k+2)-th stage, the gate terminal of the second switching element Tr2 included in the (k−4)-th stage, and the gate electrode of the (k−3)-th compensation switching element.

Of course, the carry output terminal COT of the first stage ST1 is connected to the gate electrode of the first switching element Tr1 included in the third stage ST3.

In addition, the carry output terminal COT of the second stage ST2 is connected to the gate electrode of the first switching element Tr1 included in the fourth stage ST4.

In addition, the carry output terminal COT of the third stage ST3 is connected to the gate electrode of the first switching element Tr1 included in the fifth stage ST5 and the gate electrode of the second switching element Tr2 included in the first dummy stage DM1.

The carry output terminal COT of the fourth stage ST4 is connected to the gate electrode of the first switching element Tr1 included in the sixth stage ST6, the gate electrode of the second switching element Tr2 included in the second dummy stage DM2, and the gate electrode of the first compensation switching element co1.

The carry output terminal COT of the first dummy stage DM1 is connected to the gate electrode of the first switching element Tr1 included in the first stage ST1.

The carry output terminal COT of the second dummy stage DM2 is connected to the gate electrode of the first switching element Tr1 included in the second stage ST2.

The carry output terminal COT of the third dummy stage DM3 is connected to the gate electrode of the first switching element Tr1 included in the fifth stage ST5, the gate electrode of the second switching element Tr2 included in the (m−3)-th stage Stm-3, and the gate electrode of the (m−2)-th compensation switching element com−2.

The carry output terminal COT of the fourth dummy stage DM4 is connected to the gate electrode of the first switching element Tr1 included in the sixth stage ST6, the gate electrode of the second switching element Tr2 included in the (m−2)-th stage Stm-2, and the gate electrode of the (m−1)-th compensation switching element com−1.

The carry output terminal COT of the fifth dummy stage DM5 is connected to the gate electrode of the second switching element Tr2 included in the (m−1)-th stage Stm−1, and the gate electrode of the m-th compensation switching element com.

The carry output terminal COT of the sixth dummy stage DM6 is connected to the gate electrode of the second switching element Tr2 included in the m-th stage Stm.

The carry pull-up switching element Uc included in the carry output unit CO of the k-th stage (for example, ST5 in FIG. 4) is controlled in accordance with a signal state of the k-th stage, and is connected between the clock transmission line (for example, CL5 in FIG. 4) to transmit one of plural clock pulses having different phases (for example, CLK5 in FIG. 4) and the carry output terminal COT. The carry pull-up switching element Uc is turned on or off in accordance with a voltage applied to the set node Q. In an ON state, the carry pull-up switching element Uc supplies the clock pulse CLK5 to the carry output terminal COT.

The first carry pull-down switching element Dc1 included in the carry output unit CO of the k-th stage is controlled in accordance with a signal state of the first reset node QB1 of the k-th stage, and is connected between the carry output terminal COT and the first discharge voltage line VSL1. The first carry pull-down switching element Dc1 is turned on or off in accordance with a voltage applied to the first reset node QB1. In an ON state, the first carry pull-down switching element Dc1 supplies the first discharge voltage VSS1 to the carry output terminal COT.

It may be said that the first carry pull-down switching element Dc1 included in the (4k+3)-th stage is controlled in accordance with a signal state of the first reset node QB1 of the (4k+1)-th stage, because the signal state of the first reset node QB1 of the (4k+3)-th stage depends on the signal state of the first reset node QB1 of the (4k+1)-th stage.

The second carry pull-down switching element Dc2 included in the carry output unit CO of the (k+1)-th stage is controlled in accordance with a signal state of the second reset node QB2 of the (4k+1)-th and (4k+3)-th stages connected to each other, and is connected between the carry output terminal COT and the first discharge voltage line VSL1. The second carry pull-down switching element Dc2 is turned on or off in accordance with a voltage applied to the second reset node QB2. In an ON state, the second carry pull-down switching element Dc2 supplies the first discharge voltage VSS1 to the carry output terminal COT.

The second carry pull-down switching element Dc2 included in the (4k+1)-th stage may be controlled in accordance with a signal state of the second reset node QB2 of the (4k+3)-th stage, since the signal state of the second reset node QB2 of the (4k+1)-th stage depends on the signal state of the second reset node QB2 of the (4k+3)-th stage.

The scan output unit SO includes a scan output terminal SOT, a scan pull-up switching element Us, a first scan pull-down switching element Ds1, and a second scan pull-down switching element Ds2.

The scan output unit SO outputs a scan pulse or the second discharge voltage VSS2 through the scan output terminal SOT. The scan output terminal SOT is electrically connected to the corresponding gate line. Accordingly, the scan pulse or second discharge voltage VSS2 from the scan output unit SO included in the k-th stage is supplied to the k-th gate line.

The scan pull-up switching element Us included in the scan output unit SO of the k-th stage is controlled in accordance with a signal state of the k-th stage, and is connected between one clock transmission line (for example, CL5 in FIG. 4) and the scan output terminal SOT. The scan pull-up switching element Us is turned on or off in accordance with a voltage applied to the set node Q. In an ON state, the scan pull-up switching element Us supplies the clock pulse (for example, CLK5 in FIG. 4) to the scan output terminal SOT.

The first scan pull-down switching element Ds1 included in the scan output unit SO of the k-th stage is controlled in accordance with a signal state of the first reset node QB1 of the k-th stage, and is connected between the scan output terminal SOT and the second discharge voltage line VSL2 to transmit the second discharge voltage VSS2. The first scan pull-down switching element Ds1 is turned on or off in accordance with a voltage applied to the first reset node QB1. In an ON state, the first scan pull-down switching element Ds1 supplies the second discharge voltage VSS2 to the scan output terminal SOT.

The first scan pull-down switching element Ds1 included in the (4k+3)-th stage may be controlled in accordance with a signal state of the first reset node QB1 of the (4k+1)-th stage, since the signal state of the first reset node QB1 of the (4k+3)-th stage depends on the signal state of the first reset node QB1 of the (4k+1)-th stage.

The second scan pull-down switching element Ds2 included in the scan output unit SO of the k-th stage is controlled in accordance with a signal state of the second reset node QB2 of the k-th stage, and is connected between the scan output terminal COT of the k-th stage and the second discharge voltage line VSL2. To this end, the second scan pull-down switching element Ds2 included in the k-th stage is connected, at a gate terminal thereof, to the second reset node QB2 of the k-th and (k+2)-th stages, is connected, at a drain terminal thereof, to the scan output terminal SOT of the k-th stage, and is connected, at a source terminal thereof, to the second discharge voltage line VSL2.

It may be said that the second scan pull-down switching element Ds2 included in the (4k+1)-th stage is controlled in accordance with a signal state of the second reset node QB2 of the (4k+3)-th stage, because the signal state of the second reset node QB2 of the (4k+1)-th stage depends on the signal state of the second reset node QB2 of the (4k+3)-th stage.

The node controller of the (4k+3)-th stage (a lower one of the stages connected to each other), for example, the node controller NC of the seventh stage ST7 illustrated in FIG. 4, includes first to seventh switch elements Tr1 to Tr7. Hereinafter, the switching elements will be described in detail.

The first switching element Tr1 included in the (4k+3)-th stage is controlled in accordance with a carry pulse from the (4k+1)-th stage (for example, CP5), and is connected between the charge voltage line VDL and the set node Q of the (4k+3)-th stage. The first switching element Tr1 is turned on or off in accordance with the carry pulse CP5 from the (4k+1)-th stage. In an ON state, the first switching element Tr1 supplies the charge voltage VDD to the set node Q.

The second switching element Tr2 included in the (4k+3)-th stage is controlled in accordance with a carry pulse from the (4k+7)-th stage (for example, CP11), and is connected between the set node Q of the (4k+3)-th stage and the first discharge voltage line VSL1. The second switching element Tr2 is turned on or off in accordance with the carry pulse CP11 from the (4k+7)-th stage. In an ON state, the second switching element Tr2 supplies the first discharge voltage VSS1 to the set node Q.

The third switching element Tr3 included in the (4k+3)-th stage is controlled in accordance with a signal state of the first reset node QB1 of the (4k+1)-th and (4k+3)-th stages connected to each other, and is connected between the set node Q of the (4k+3)-th stage and the first discharge voltage line VSL1. The third switching element Tr3 is turned on or off in accordance with a voltage applied to the first reset node QB1. In an ON state, the third switching element Tr3 supplies the first discharge voltage VSS1 to the set node Q.

The fourth switching element Tr4 included in the (4k+3)-th stage is controlled in accordance with a signal state of the second reset node QB2 of the (4k+1)-th and (4k+3)-th stages connected to each other, and is connected between the set node Q of the (4k+1)-th stage and the first discharge voltage line VSL1. The fourth switching element Tr4 is turned on or off in accordance with a voltage applied to the second reset node QB2. In an ON state, the fourth switching element Tr4 supplies the first discharge voltage VSS1 to the set node Q.

The fifth switching element Tr5 included in the (4k+3)-th stage is controlled in accordance with a signal state of the set node Q of the (4k+3)-th stage, and is connected between the second reset node QB2 of the (4k+1)-th and (4k+3)-th stages and the second discharge voltage line VSL2. The fifth switching element Tr5 is turned on or off in accordance with a voltage applied to the set node Q. In an ON state, the fifth switching element Tr5 supplies the first discharge voltage VSS1 to the second reset node QB2.

The sixth switching element Tr6 included in the (4k+3)-th stage is controlled in accordance with a signal state of the set node Q of the (4k+3)-th stage, and is connected between a second AC voltage line ACL2 to transmit the second AC voltage Vac2 and the first discharge voltage line VSL1. The sixth switching element Tr6 is turned on or off in accordance with a voltage applied to the set node Q. In an ON state, the sixth switching element Tr6 supplies the first discharge voltage VSS1 to the second AC voltage line ACL2.

The seventh switching element Tr7 included in the (4k+3)-th stage is controlled in accordance with the second AC voltage Vac2 from the second AC voltage line ACL2, and is connected between the second reset node QB2 of the (4k+1)-th and (4k+3)-th stages and the second AC voltage line ACL2. The seventh switching element Tr7 is turned on or off in accordance with the second AC voltage Vac2. In an ON state, the seventh switching element Tr7 supplies the second AC voltage Vac2 to the second reset node QB2.

The configurations of the carry output unit and scan output unit in the (4k+3)-th stage are identical to those of the (k+2)-th stage.

Thus, the carry output unit CO included in each of the stages ST1 to STm and DM1 to DM6 outputs a carry pulse in an output period thereof during one frame period, to control operations of the downstream stage, upstream stage, and compensation switching element associated therewith. In addition, the carry output unit CO supplies the first discharge voltage VSS1 input from the outside to the downstream stage, upstream stage, and compensation switching element associated therewith in a non-output period thereof during one frame period.

The scan output unit SO included in each of the stages ST1 to STm outputs a scan pulse in the output period thereof, to drive the corresponding gate line. In addition, the scan output unit SO supplies the second discharge voltage VSS2 to the corresponding gate line in the non-output period thereof.

Hereinafter, operation of the shift register configured as described above will be described with reference to FIGS. 4 and 5.

Figure 5:
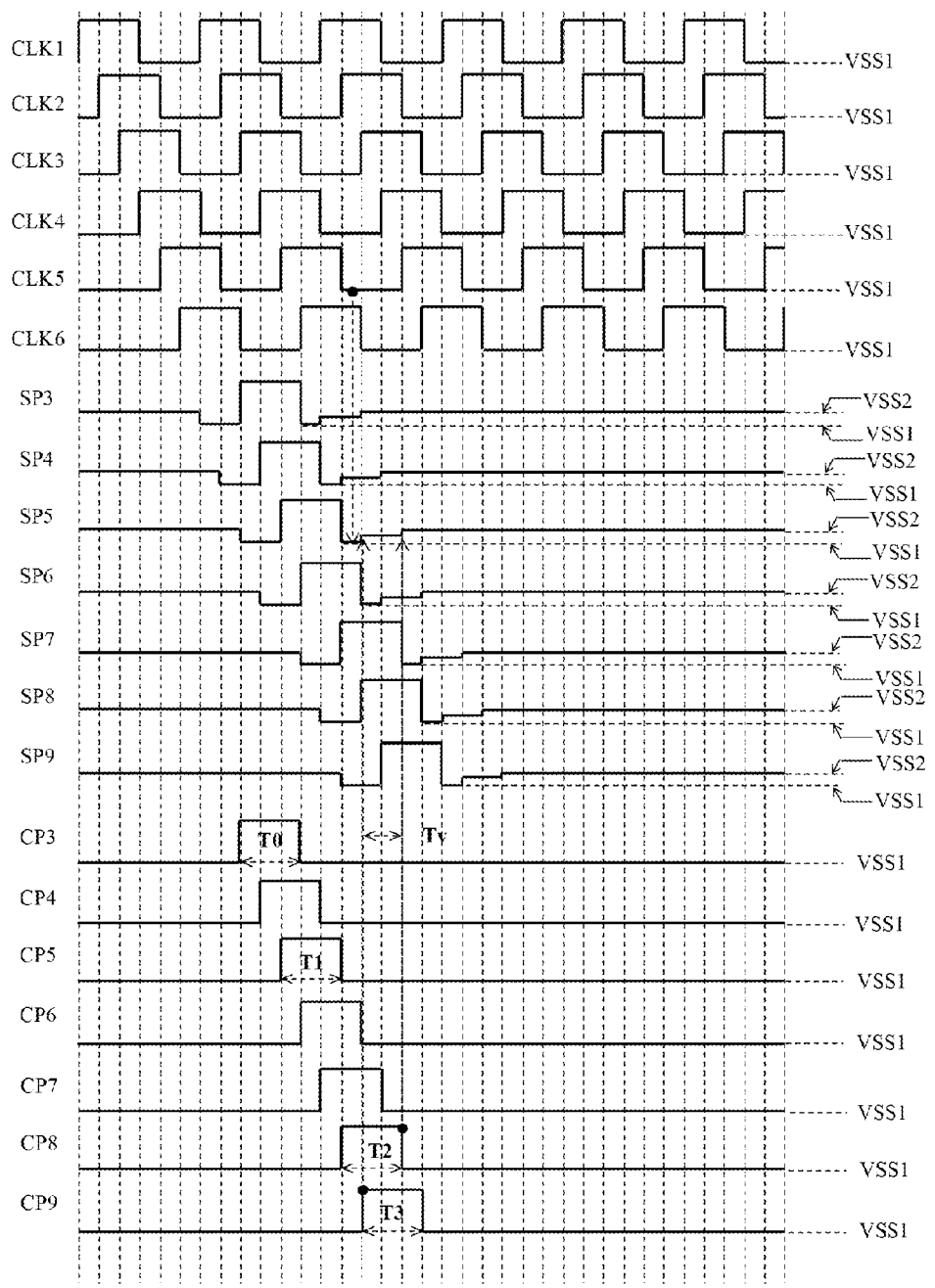
FIG. 5 is a timing diagram of the first to sixth clock pulses, the first to ninth scan pulses, and the first to ninth carry pulses.

FIG. 5 is a timing diagram of first to sixth clock pulses, first to ninth scan pulses, and first to ninth carry pulses.

First, operation of the fifth stage ST5 in an initial period T0 included in a first frame period will be described.

During the first frame period, the first AC voltage Vac1 exhibits positive polarity, and the second AC voltage Vac2 exhibits negative polarity.

In the initial period T0, as illustrated in FIG. 4, a high-level third carry pulse CP3 from the third stage ST3 is input to the fifth stage ST5.

That is, the carry pulse CP3 is supplied to the gate electrode of the first switching element Tr1 included in the fifth stage ST5. The first switching element Tr1 is turned on and the charge voltage VDD is applied to the set node Q through the turned-on first switching element Tr1. As a result, the set node Q is charged and the carry pull-up switching element Uc, scan pull-up switching element Us, fifth switching element Tr5, and sixth switching element Tr6 of the fifth stage ST5, which are connected, at the gate electrodes thereof, to the charged set node Q, are turned on.

In this case, the first discharge voltage VSS1 is supplied to the first reset node QB1 of the fifth stage ST5 through the turned-on fifth switching element Tr5 and, as such, the first reset node QB1 is discharged. As a result, the first carry pull-down switching element Dc1, first scan pull-down switching element Ds1, and third switching element Tr3 of the fifth stage ST5, which are connected, at the gate electrodes thereof, to the discharged first reset node QB1, are turned off. In this case, the first reset node QB1 of the seventh stage ST7 is also in a discharged state because the first reset node QB1 of the fifth stage ST5 is electrically connected to the first reset node QB1 of the seventh stage ST7. Accordingly, the first carry pull-down switching element Dc1, first scan pull-down switching element Ds1, and third switching element Tr3 of the seventh stage ST7, which are connected, at the gate electrodes thereof, to the discharged first reset node QB1 of the seventh stage ST7, are turned off.

Since the first AC voltage Vac1 is maintained in a positive polarity state during the first frame period, the positive first AC voltage Vac1 is applied to the gate electrode of the seventh switching element Tr7 included in the fifth stage ST5. In this case, the first discharge voltage VSS1 output through the turned-on sixth switching element Tr6 is also supplied to the gate electrode of the seventh switching element Tr7. That is, both the positive first AC voltage Vac1 and the first discharge voltage VSS1 are supplied to the gate electrode of the seventh switching element Tr7.

In this case, however, the gate electrode of the seventh switching element Tr7 is maintained at the first discharge voltage VSS1 because the size of the sixth switching element Tr6 supplying the first discharge voltage VSS1 is set to be greater than the size corresponding to the first AC voltage Vac1. Accordingly, the seventh switching element Tr7 is turned off.

The second reset node QB2 of the seventh stage ST7 is maintained in a discharged state during the initial period T0. Accordingly, the second carry pull-down switching element Dc2, second scan pull-down switching element Ds2, and fourth switching element Tr4 of the seventh stage ST7, the gate terminals of which are connected to the second reset node QB2 of the seventh stage ST7, are turned off. In addition, since the second reset node QB2 of the seventh stage ST7 is electrically connected to the second reset node QB2 of the fifth stage ST5, the second reset node QB2 of the fifth stage ST5 is also in a discharged state. Accordingly, the second carry pull-down switching element Dc2, second scan pull-down switching element Ds2, and fourth switching element Tr4 connected to the second reset node QB2 are maintained in an OFF state.

In the initial period T0, the second switching element Tr2 of the fifth stage ST5 is in an OFF state because there is no carry pulse CP9 supplied from the ninth stage ST9, that is, the carry pulse CP9 has a low level state.

As a result, in the initial period T0, the first stage ST1 charges the set node Q thereof while discharging the first reset node QB1 thereof and the first reset node QB1 of the seventh stage ST7. In the initial period T0, the seventh stage ST7 discharges the set node Q thereof, the second reset node QB2 thereof, and the second reset node QB2 of the fifth stage ST5.

Next, operation in a first period T1 will be described.

The first period T1 is a period corresponding to an output period of the fifth stage ST5. In the first period T1, a high-level fifth clock pulse CLK5 is input to the fifth stage ST5.

In this case, the set node Q of the fifth stage ST5 is maintained in a state of being charged by the charge voltage VDD applied in the initial period T0 and the carry pull-up switching element Uc and scan pull-up switching element Us of the fifth stage ST5 are maintained in an ON state. Accordingly, the fifth clock pulse CLK5 is applied to the drain electrodes of the turned-on carry pull-up switching element Uc and scan pull-up switching element Us and the carry pull-up switching element Uc and scan pull-up switching element Us outputs a carry pulse and a scan pulse, respectively.

In this case, the fifth clock pulse CLK5 output through the carry pull-up switching element Uc is the fifth carry pulse CP5, and the fifth clock pulse CLK5 output through the scan pull-up switching element Us is the fifth scan pulse SP5. The fifth carry pulse CP5 is supplied to the seventh stage ST7, to enable the seventh stage ST7. The fifth scan pulse SP5 is supplied to the fifth gate line GL5, to drive the fifth gate line GL5.

The fifth carry pulse CP5 output from the fifth stage ST5 is supplied to the gate electrode of the first switching element Tr1 included in the seventh stage ST7. Accordingly, the seventh stage ST7 is enabled in the first period T1. The enabling operation of the seventh stage ST7 in the first period T1 is identical to the above-described enabling operation of the fifth stage ST5 in the initial period T0.

The fifth carry pulse CP5 is also applied to the gate electrode of the second compensation switching element co2.

When the second compensation switching element co2 is turned on by the fifth carry pulse CP5, the first discharge voltage VSS1 is applied to a left side of the second gate line GL2 via the turned-on compensation switching element co2. At this time, the first discharge voltage VSS1 generated from the second stage ST2 begins to be applied to a right side of the second gate line GL2. Accordingly, it may be possible to increase the discharge speed of the gate line because the first discharge voltage VSS1 is applied to both sides of the gate line. That is, the falling edge time of the scan pulse applied to the gate line may be reduced.

Next, operation in a second period T2 will be described.

In the second period T2, the eighth carry pulse CP8 is generated from the eighth stage ST8, and is applied to the gate electrode of the fifth compensation switching element co5. As a result, the fifth compensation switching element co5 is turned on and the first discharge voltage VSS1 is applied to a right side of the fifth gate line GL5 via the turned-on compensation switching element co5. At this time, a low-level scan pulse SP5 generated from the fifth stage ST5 begins to be applied to a left side of the fifth gate line GL5. The low-level scan pulse SP5 is based on the fifth clock pulse and has the same level as the first discharge voltage VSS1. Thus, the first discharge voltage VSS1 is applied to both sides of the fifth gate line GL5 in the second period T2.

Next, operation in a third period T3 will be described.

In the third period T3, a high-level ninth carry pulse CP9 generated from the ninth stage ST9 is input to the fifth stage ST5 and the fifth stage ST5 is disabled. The disabling operation will be described in more detail.

That is, the ninth carry pulse CP9 is supplied to the gate electrode of the second switching element Tr2 included in the fifth stage ST5 and the second switching element Tr2 of the fifth stage ST5 is turned on. Through the turned-on second switching element Tr2, the first discharge voltage VSS1 is supplied to the set node Q of the fifth stage ST5. As a result, the set node Q is discharged and the carry pull-up switching element Uc, scan pull-up switching element Us, fifth switching element Tr5 and sixth switching element Tr6, the gate electrodes of which are connected to the discharged set node Q, are turned off.

In accordance with turning-off of the fifth and sixth switching elements Tr5 and Tr6 in the fifth stage ST5, the seventh switching element Tr7 included in the fifth stage ST5 is turned on. Through the turned-on seventh switching element Tr7, the first AC voltage Vac1 is applied to the first reset node QB1. As a result, the first reset node QB1 of the fifth stage ST5 and the first reset node QB1 of the seventh stage ST7 connected thereto are charged. Accordingly, the first carry pull-down switching element Dc1, first scan pull-down switching element Ds1 and third switching element Tr3 of the fifth stage ST5 and the first carry pull-down switching element Dc1, first scan pull-down switching element Ds1 and third switching element Tr3 of the seventh stage ST7, the gate electrodes of which are connected to corresponding ones of the charged first reset nodes QB1, are turned on.

The first discharge voltage VSS1 is supplied to the set node Q of the fifth stage ST5 via the turned-on third switching element Tr3 of the fifth stage ST5 and the discharged state of the set node Q is more stably maintained. In addition, the first discharge voltage VSS1 is supplied to the set node Q of the seventh stage ST7 via the turned-on third switching element Tr3 of the seventh stage ST7 and the discharged state of the set node Q is more stably maintained.

Thus, in the third period T3, the fifth and seventh stages ST5 and ST7 simultaneously output the first discharge voltage VSS1 because the first carry pull-down switching element Dc1 and first scan pull-down switching element Ds1 of the fifth stage ST5 and the first carry pull-down switching element Dc1 and first scan pull-down switching element Ds1 of the seventh stage ST7 are turned on.

That is, the first carry pull-down switching element Dc1 of the fifth stage ST5 outputs the first discharge voltage VSS1 which is, in turn, supplied to the first stage ST1. The first scan pull-down switching element Ds1 of the fifth stage ST5 outputs the second discharge voltage VSS2 which is, in turn, supplied to the fifth gate line GL5. Accordingly, in the third period T3, the voltage of the fifth gate line GL5 rises from the level of the first discharge voltage VSS1 to the level of the second discharge voltage VSS2. In the third period T3, the first discharge voltage VSS1 is also supplied to the fifth gate line GL5 via the turned-on fifth compensation switching element co5 and the voltage of the fifth gate line GL5 rises to a level between the first discharge voltage VSS1 and the second discharge voltage VSS2 without rising to the second discharge voltage VSS2 in an overlap period Tv of the third period T3 in which both the eighth carry pulse CP8 and the ninth carry pulse CP9 are in a high-level state. Subsequently, the voltage of the fifth gate line GL5 rises to the level of the second discharge voltage VSS2 at a time when the eighth carry pulse CP8 transitions to a low-level state. The compensation switching element is set to have a smaller size than the scan pull-down switching element Ds1 or Ds2 and the voltage of the gate line is maintained at the level of the second discharge voltage VSS2 even in the above-described overlap period Tv.

The first carry pull-down switching element Dc1 of the seventh stage ST7 outputs the first discharge voltage VSS1 which is, in turn, supplied to the third stage ST3. The first scan pull-down switching element Ds1 of the seventh stage ST7 outputs the second discharge voltage VSS2 which is, in turn, supplied to the seventh gate line GL7.

The remaining stages operate in the above-described manner.

Thereafter, in a second frame period, the first AC voltage Vac1 is maintained at a negative polarity state, and the second AC voltage Vac2 is maintained at a positive polarity state. Accordingly, in a disable period, the first reset node QB1 of the fifth stage ST5 is discharged, and the second reset node QB2 of the fifth stage ST5 is charged.

That is, in the second frame period, the second carry pull-down switching element Dc2 and second scan pull-down switching element Ds2 of the fifth stage ST5 are turned on, and the first carry pull-down switching element Dc1 and first scan pull-down switching element Ds1 of the fifth stage ST5 are turned off.

In the second frame period, the first carry pull-down switching element Dc1 and first scan pull-down switching element Ds1 of the seventh stage ST7 are turned on, and the second carry pull-down switching element Dc2 and second scan pull-down switching element Ds2 of the seventh stage ST7 are turned off.

The remaining stages operate in the same manner as described above.

During the disable period, the leakage current from the first switching element Tr1 may be reduced since the gate electrode of the first switching element Tr1 is connected to the carry output terminal COT.

Figure 6:
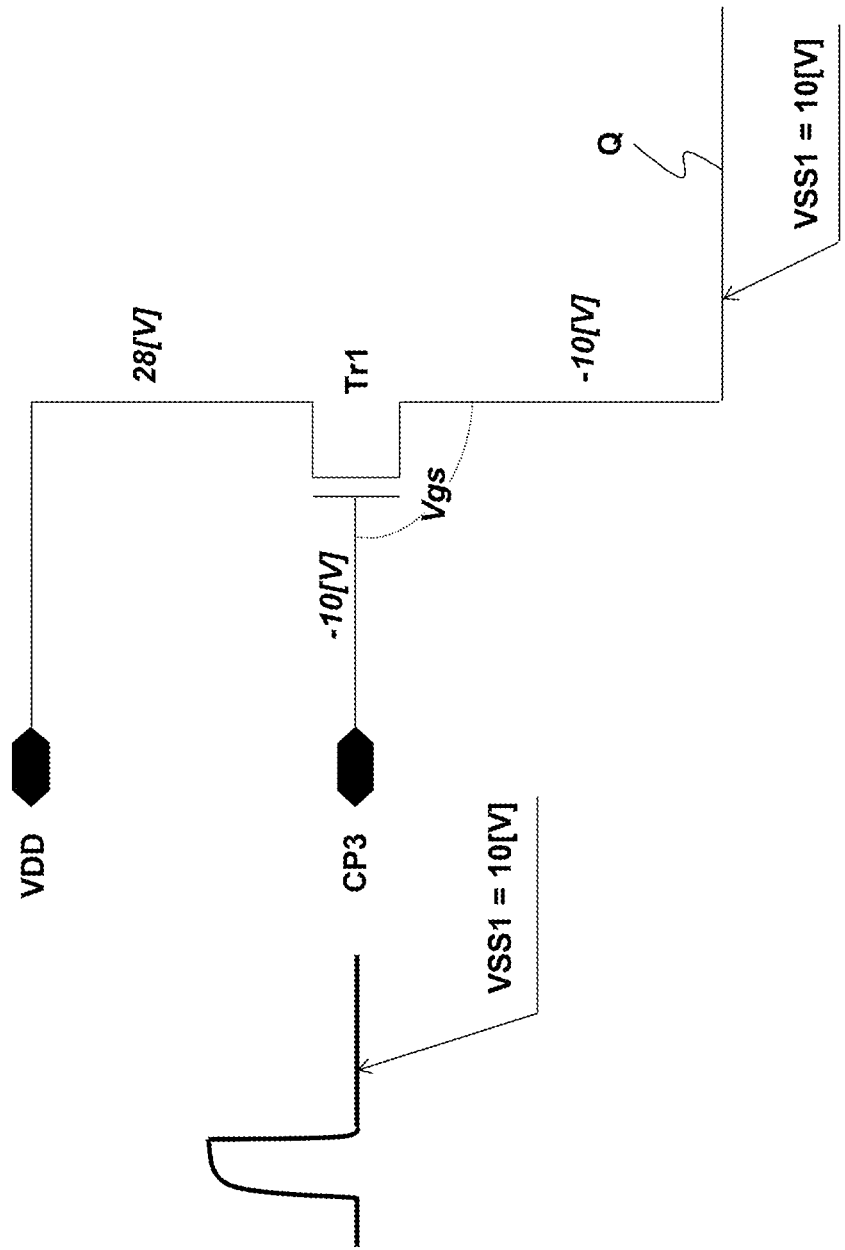
FIG. 6 is a diagram illustrating a state of a voltage applied to a first switching element in a disable period.

FIG. 6 is a diagram illustrating a state of a voltage applied to the first switching element in the disable period.

For example, as illustrated in FIG. 6, when the fifth stage ST5 is disabled, the voltage at the set node Q in the fifth stage ST5 falls to the level of the first discharge voltage VSS1. At this time, a low-level carry pulse CP3 is generated from the third stage ST3, and is applied to the gate electrode of the first switching element Tr1. In this case, the low-level carry pulse CP3 has the level of the first discharge voltage VSS1 and, as such, the gate-source voltage of the first switching element Tr1, namely, Vgs, becomes 0. Accordingly, the first switching element Tr1 may be stably maintained in an OFF state during the disable period and it may be possible to prevent the set node Q from being charged by the charge voltage VDD during the disable period.

Figure 7:
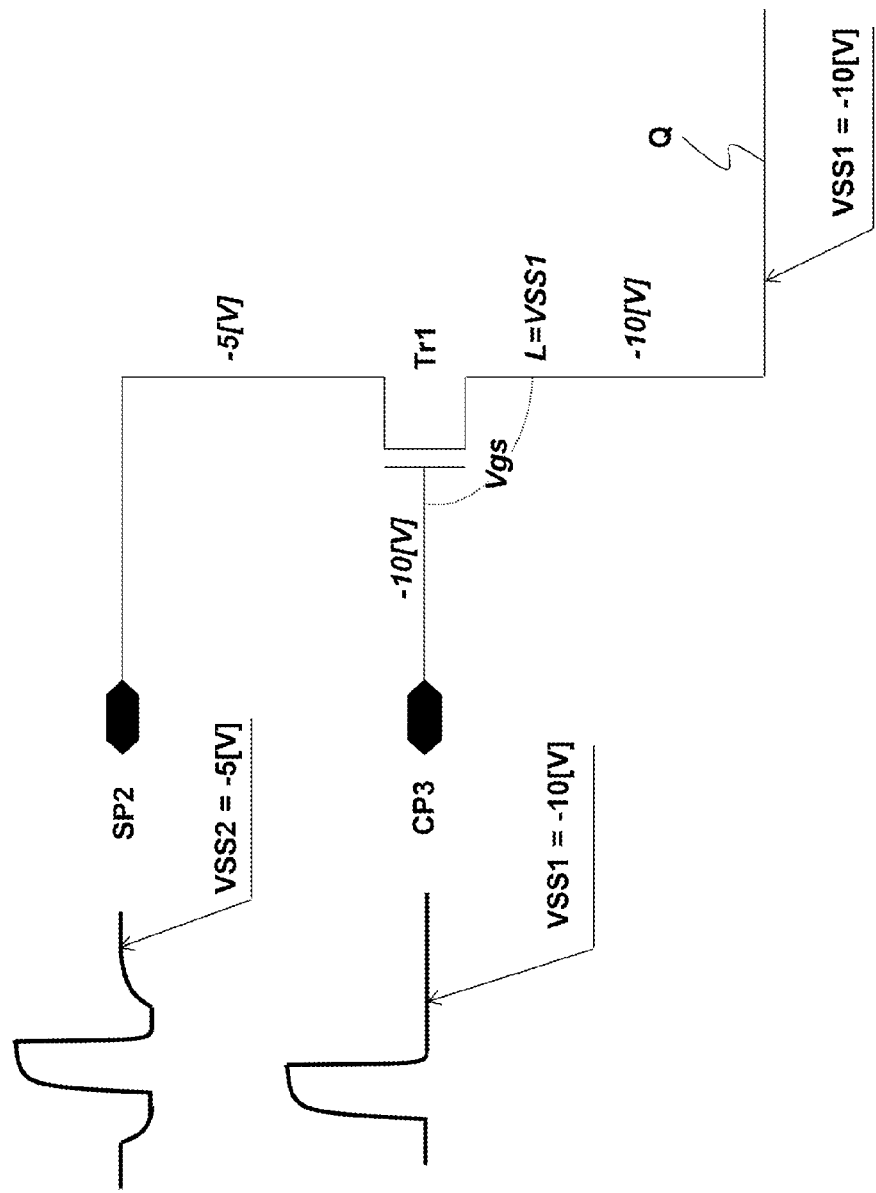
FIG. 7 is a diagram illustrating a state of another voltage applied to the first switching element in the disable period.

FIG. 7 is a diagram illustrating a state of another voltage applied to the first switching element in the disable period.

In pace of the above-described charge voltage VDD, the scan pulse SP2 may be applied to the drain electrode of the first switching element Tr1 illustrated in FIG. 7. That is, the scan pulse from the k−3-th stage may be applied to the drain electrode of the first switching element Tr1 included in the k-th stage. Effects in the case of FIG. 7 are identical to those of FIG. 6.

When the first switching element Tr1 is configured as illustrated in FIG. 7, it may be possible to remove the charge voltage line VDL and reduce the size of the shift register.

In addition, in order to achieve an enhancement in drivability of the shift register while reducing leakage current, two discharge voltages VSS1 and VSS2 are supplied to each stage, and the output unit of each stage is divided into a carry output unit CO connected to a relatively small load and a scan output unit SO connected to a relatively large load and a small pull-up switching element and the first discharge voltage VSS1 are provided at the carry output unit CO, and a large pull-up switching element and the second discharge voltage VSS2 are provided at the scan output unit SO. In accordance with this configuration, it may be possible to reduce the generation of leakage current.

The above-described effects of the present invention and a principle associated therewith will be described in more detail.

In each stage, switching elements most importantly associated with the output of the stage are the scan pull-up switching element Us included in the scan output unit SO and the carry pull-up switching element Uc included in the carry output unit CO.

The scan pull-up switching element Us included in the scan output unit SO is connected to a greater load than that of the carry pull-up switching element Uc included in the carry output unit CO. This is because the carry pull-up switching element Uc is connected to an upstream stage and a downstream stage, whereas the scan pull-up switching element Us is connected to a gate line and a number of switching elements connected to the gate line.

The scan pull-up switching element Us is adapted to drive the associated gate line and is required to generate a higher output than that of the carry pull-up switching element Uc, which is adapted to control the upstream and downstream stages. To this end, in order to form pull-up switching elements on a limited area at a maximum degree of integration, the scan pull-up switching element Us, which is connected to a greater load and generates a higher output, has a larger size than the carry pull-up switching element Uc.

The carry pull-up switching element Uc is connected to a smaller load than that of the scan pull-up switching element Us and there is no problem in controlling operations of the upstream and downstream stages even when the output from the carry pull-up switching element Uc is relatively low.

In accordance with the above-described structure, the carry pull-up switching element Uc has a higher internal resistance than the scan pull-up switching element Us and it may be possible to reduce generation of leakage current from the carry pull-up switching element Uc in an OFF state of the carry pull-up switching element Uc.

The scan pull-up switching element Us may have a structure weak to leakage current in an OFF state thereof due to the large size thereof. However, generation of such leakage current may be prevented because different discharge voltages are supplied to the gate and source terminals of the scan pull-up switching element Us, respectively, when the scan pull-up switching element Us is turned off. That is, when the scan pull-up switching element Us is turned off, the first discharge voltage VSS1 is supplied to the gate terminal of the scan pull-up switching element Us, whereas the second discharge voltage VSS2 higher than the first discharge voltage VSS1 is supplied to the source terminal of the scan pull-up switching element Us and the gate-source voltage of the scan pull-up switching element Us is maintained at a negative level lower than 0. When it is assumed that the scan pull-up switching element Us is an NMOS transistor, the scan pull-up switching element Us may be maintained in a completely turned-off state.

When a PMOS transistor is used as the scan pull-up switching element Us, the first discharge voltage VSS1 and second discharge voltage VSS2 may be set such that the first discharge voltage VSS1 has a higher voltage value than the second discharge voltage VSS2. In this case, accordingly, there are effects of reducing the generation of leakage current from the scan pull-up switching element Us even though the scan pull-up switching element Us is formed to have a large size for generation of a high output.

In addition, since the first discharge voltage VSS1 is lower than the second discharge voltage VSS2, it may be possible to reduce stress applied to the pull-down switching elements Dc1, Dc2, Ds1, and Ds2.

When the low-level voltage value of the clock pulse supplied to the drain terminal of the scan pull-up switching element Us is set to be lower than the second discharge voltage VSS2 or to be equal to the first discharge voltage VSS1, the voltage of the scan pulse may rapidly fall from a high level to a low level and it may be possible to reduce the falling edge time of the scan pulse supplied to the associated gate line. In this case, accordingly, an increased margin between scan pulses may be achieved. Thus, it is unnecessary to set pull-up switching elements and pull-down switching elements to have large sizes for reduction of the falling edge time of scan pulses and it may be possible to considerably reduce the size of the shift register. In addition, it may be possible to reduce the bezel size of the display apparatus.

In addition there is no direct connection between the stages arranged at the left side of the gate lines and the stages arranged at the right side of the gate lines and it may be possible to reduce the number of dummy stages used in the shift register.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A shift register comprising:
a plurality of stages for sequentially outputting output pulses comprising carry pulses and scan pulses, the plurality of stages including odd-numbered stages and even-numbered stages,
wherein each of the odd-numbered stages of the plurality of stages supplies a scan pulse to a corresponding odd-numbered gate line in a sequential manner, and each of the even-numbered stages of the plurality of stages supplies a scan pulse to a corresponding even-numbered gate lines in a sequential manner;
wherein each of the stages of the plurality of stages comprises:
a carry output unit for generating a carry pulse, the carry output unit coupled to a first discharge voltage and a clock pulse, the clock pulse having a low-level voltage equal to the first discharge voltage, and supplying the generated carry pulse to at least one of an upstream stage and a downstream stage of the plurality of stages, the first discharge voltage for discharging the carry output unit, and a scan output unit for generating a scan pulse, the scan output unit coupled to a second discharge voltage and the clock pulse, the second discharge voltage having a higher voltage value than the first discharge voltage, the second discharge voltage for discharging the scan output unit, and supplying the generated scan pulse to a corresponding gate line.

2. The shift register according to claim 1, further comprising:
compensation switching elements each of which is controlled in accordance with corresponding scan pulses from the plurality of stages, to supply the first discharge voltage to one of the gate lines.

3. The shift register according to claim 2, wherein:
the compensation switching stages include odd-numbered compensation switching elements and even-numbered compensation switching elements;
each of the odd-numbered compensation switching elements is controlled by the scan pulse from a corresponding even-numbered stage, and is connected between a first discharge voltage line to transmit the first discharge voltage and a corresponding odd-numbered gate line; and
each of the even-numbered compensation switching elements is controlled by the scan pulse from a corresponding odd-numbered stage, and is connected between the first discharge voltage line and a corresponding even-numbered gate line.

4. The shift register according to claim 3, wherein the even-numbered compensation switching elements are arranged at a first side of the gate lines, and the odd-numbered compensation switching elements are arranged at a second side of the gate lines, the second side of the gate lines opposite to the first side of the gate lines.

5. The shift register according to claim 3, wherein:
an n-th stage of the plurality of stages, n being a natural number greater than 5, comprises a node controller for controlling signal states of a set node, a first reset node and a second reset node; and
the node controller of the n-th stage comprises a first switching element controlled in accordance with the carry pulse from the (n−x)-th stage, x being a natural number smaller than n, and connected between a charge voltage line to transmit a charge voltage and the set node.

6. The shift register according to claim 5, wherein:
a first reset node of a (4k+1)-th stage of the plurality of stages, k being a natural number, is connected to a first reset node of a (4k+3)-th stage of the plurality of stages;
a second reset node of the (4k+1)-th stage is connected to a second reset node of the (4k+3)-th stage;
a first reset node of a (4k+2)-th stage of the plurality of stages is connected to a first reset node of a (4k+4)-th stage of the plurality of stages;
a second reset node of the (4k+2)-th stage is connected to a second reset node of the (4k+4)-th stage;
a clock pulse applied to the (4k+1)-th stage and a clock pulse applied to the (4k+3)-th stage have different phases; and
a clock pulse applied to the (4k+2)-th stage and a clock pulse applied to the (4k+4)-th stage have different phases.

7. The shift register according to claim 6, wherein, when the n-th stage corresponds to one of the (4k+1)-th stage and the (4k+2)-th stage, the node controller of the n-th stage further comprises:

a second switching element controlled in accordance with a carry pulse from a (n+y)-th stage, y being a natural number, and connected between the set node and the first discharge voltage line to the first discharge voltage;
a third switching element controlled in accordance with a voltage at the first reset node, and connected between the set node and the first discharge voltage line;
a fourth switching element controlled in accordance with a voltage at the second reset node, and connected between the set node and the first discharge voltage line;
a fifth switching element controlled in accordance with a voltage at the set node, and connected between the first reset node and the first discharge voltage line;
a sixth switching element controlled in accordance with the voltage at the set node, and connected between a first AC voltage line to transmit a first AC voltage and the first discharge voltage line; and
a seventh switching element controlled in accordance with the first AC voltage, and connected between the first AC voltage line and the first reset node.

8. The shift register according to claim 7, wherein x is 2, and y is 4.

9. The shift register according to claim 6, wherein, when the n-th stage corresponds to one of the (4k+3)-th stage and the (4k+4)-th stage, the node controller of the n-th stage further comprises:
a second switching element controlled in accordance with the carry pulse from a (n+y)-th stage, y being a natural number, and connected between the set node and the first discharge voltage line to the first discharge voltage;
a third switching element controlled in accordance with a voltage at the first reset node, and connected between the set node and the first discharge voltage line;
a fourth switching element controlled in accordance with a voltage at the second reset node, and connected between the set node and the first discharge voltage line;
a fifth switching element controlled in accordance with a voltage at the set node, and connected between the second reset node and the first discharge voltage line;
a sixth switching element controlled in accordance with the voltage at the set node, and connected between a second AC voltage line to transmit a second AC voltage and the first discharge voltage line; and
a seventh switching element controlled in accordance with the second AC voltage, and connected between the second AC voltage line and the second reset node.

10. The shift register according to claim 9, wherein x is 2, and y is 4.

11. The shift register according to claim 6, wherein:
the carry output unit of the n-th stage comprises:
a carry pull-up switching element controlled in accordance with a voltage at the set node, and connected between a clock transmission line to transmit the clock pulse and a carry output terminal of the n-th stage,
a first carry pull-down switching element controlled in accordance with a voltage at the first reset node, and connected between the carry output terminal of the n-th stage and the first discharge voltage line to transmit the first discharge voltage, and
a second carry pull-down switching element controlled in accordance with a voltage at the second reset node, and connected between the carry output terminal of the n-th stage and the first discharge voltage line; and the carry output terminal of the n-th stage is further connected to an (n+x)-th stage of the plurality of stages, an (n−y)-th stage of the plurality of stages, and an (n−z)-th compensation switching element.

12. The shift register according to claim 11, wherein x is 2, y is 4, and z is 2.

13. The shift register according to claim 6, wherein:

the scan output unit of the n-th stage comprises:
 a scan pull-up switching element controlled in accordance with a voltage at the set node, and connected between a clock transmission line to transmit the clock pulse and a scan output terminal of the n-th stage,
 a first scan pull-down switching element controlled in accordance with a voltage at the first reset node, and connected between the scan output terminal of the n-th stage and the second discharge voltage line to transmit the second discharge voltage, and
 a second scan pull-down switching element controlled in accordance with a voltage at the second reset node, and connected between the scan output terminal of the n-th stage and the second discharge voltage line; and
  the scan output terminal of the n-th stage is further connected to an n-th one of the gate lines.

14. The shift register according to claim 1, further comprising:
 a first dummy stage for receiving a start pulse from an external source, generating a first dummy pulse, based on the start pulse, and supplying the first dummy pulse to a first stage of the plurality of stages to generate a first output pulse in one frame period; and
 a second dummy stage for receiving the start pulse, generating a second dummy pulse, based on the start pulse, and supplying the second dummy pulse to a second stage of the plurality of stages to generate a second output pulse in one frame period,
 wherein the first dummy pulse is output earlier than the second dummy pulse.

15. The shift register according to claim 14, wherein:

the first dummy stage comprises a node controller for controlling signal states of a set node, a first reset node and a second reset node; and the node controller of the first dummy stage comprises a first switching element controlled in accordance with the first dummy pulse from the first dummy stage, and connected between a charge voltage line to transmit a charge voltage and the set node.

16. The shift register according to claim 15, wherein the node controller of the first stage further comprises:
 a second switching element controlled in accordance with a carry pulse from a downstream stage of the plurality of stages to generate an output later than the first stage, and connected between the set node and the first discharge voltage line to the first discharge voltage;
 a third switching element controlled in accordance with a voltage at the first reset node, and connected between the set node and the first discharge voltage line;
 a fourth switching element controlled in accordance with a voltage at the second reset node, and connected between the set node and the first discharge voltage line;
 a fifth switching element controlled in accordance with a voltage at the set node, and connected between the first reset node and the first discharge voltage line;
 a sixth switching element controlled in accordance with the voltage at the set node, and connected between a first AC voltage line to transmit a first AC voltage and the first discharge voltage line; and
 a seventh switching element controlled in accordance with the first AC voltage, and connected between the first AC voltage line and the first reset node.

17. The shift register according to claim 16, wherein the downstream stage is a fifth stage of the plurality of stages.

18. The shift register according to claim 14, wherein:

the second stage comprises a node controller for controlling signal states of a set node, a first reset node and a second reset node; and the node controller of the second stage comprises a first switching element controlled in accordance with the second dummy pulse from the second dummy stage, and connected between a charge voltage line to transmit a charge voltage and the set node.

19. The shift register according to claim 18, wherein the node controller of the second stage further comprises:
 a second switching element controlled in accordance with the carry pulse from a downstream stage of the plurality of stages to generate an output later than the second stage, and connected between the set node and the first discharge voltage line to the first discharge voltage;
 a third switching element controlled in accordance with a voltage at the first reset node, and connected between the set node and the first discharge voltage line;
 a fourth switching element controlled in accordance with a voltage at the second reset node, and connected between the set node and the first discharge voltage line;
 a fifth switching element controlled in accordance with a voltage at the set node, and connected between the first reset node and the first discharge voltage line;
 a sixth switching element controlled in accordance with the voltage at the set node, and connected between a first AC voltage line to transmit a first AC voltage and the first discharge voltage line; and
 a seventh switching element controlled in accordance with the first AC voltage, and connected between the first AC voltage line and the first reset node.

20. The shift register according to claim 19, wherein the downstream stage is a sixth stage of the plurality of stages.

21. The shift register according to claim 14, wherein:

the first reset node of the first stage is connected to the first reset node of a third stage of the plurality of stages;

the first reset node of the second stage is connected to the first reset node of a fourth one of the stages;

the clock pulse applied to the first stage and the clock pulse applied to the third stage have different phases; and the clock pulse applied to the second stage and the clock pulse applied to the fourth stage have different phases.

22. The shift register according to claim 1, wherein, when a last stage of the plurality of stages to generates an output pulse in one frame period is an m-th stage of the plurality of stages, the shift register further comprises:
 a third dummy stage for supplying a third dummy pulse to an (m−3)-th stage of the plurality of stages;
 a fourth dummy stage for supplying a fourth dummy pulse to an (m−2)-th stage of the plurality of stages;
 a fifth dummy stage for supplying a fifth dummy pulse to an (m−1)-th stage of the plurality of stages; and
 a sixth dummy stage for supplying a sixth dummy pulse to the m-th stage of the plurality of stages.

23. The shift register according to claim 22, wherein:
the third dummy pulse from the third dummy stage is further supplied to an (m−2)-th compensation switching element; and
the (m−2)-th compensation switching element is controlled in accordance with the third dummy pulse, and is connected between the first discharge voltage line to transmit the first discharge voltage and an (m−2)-th gate line.

24. The shift register according to claim 22, wherein:
the fourth dummy pulse from the fourth dummy stage is further supplied to an (m−1)-th compensation switching element; and
the (m−1)-th compensation switching element is controlled in accordance with the fourth dummy pulse, and is connected between the first discharge voltage line to transmit the first discharge voltage and an (m−1)-th gate line.

25. The shift register according to claim 22, wherein:
the fifth dummy pulse from the fifth dummy stage is further supplied to an m-th compensation switching element; and
the m-th compensation switching element is controlled in accordance with the fifth dummy pulse, and is connected between the first discharge voltage line to transmit the first discharge voltage and an m-th gate line.

26. The shift register according to claim 22, wherein each of the first to fourth dummy pulses is generated, based on the first discharge voltage and the clock pulse having the low-level voltage equal to the first discharge voltage.

27. The shift register according to claim 1, wherein the odd-numbered stages are arranged at a first side of the gate lines, and the even-numbered stages are arranged at a second side of the gate lines, the second side of the gate lines opposite to the first side of the gate lines.

* * * * *